US010665161B2

(12) United States Patent
Ota

(10) Patent No.: US 10,665,161 B2
(45) Date of Patent: May 26, 2020

(54) PIXEL CIRCUIT, ELECTRO-OPTICAL DEVICE, AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/909,534

(22) Filed: Mar. 1, 2018

(65) Prior Publication Data

US 2018/0261155 A1 Sep. 13, 2018

(30) Foreign Application Priority Data

Mar. 13, 2017 (JP) ................. 2017-047109

(51) Int. Cl.
*G09G 3/3233* (2016.01)
*H01L 51/52* (2006.01)
*H01L 27/32* (2006.01)

(52) U.S. Cl.
CPC ....... *G09G 3/3233* (2013.01); *H01L 27/3276* (2013.01); *H01L 51/5206* (2013.01); *H01L 51/5221* (2013.01); *G09G 2300/0861* (2013.01); *G09G 2310/0251* (2013.01); *G09G 2310/0262* (2013.01); *G09G 2310/0264* (2013.01)

(58) Field of Classification Search
CPC ......... G09G 3/3233; G09G 2300/0861; G09G 2310/0251; G09G 2310/0262; G09G 2310/0264; H01L 27/3276; H01L 51/5206; H01L 51/5221

USPC .......................................................... 345/76
See application file for complete search history.

(56) References Cited

U.S. PATENT DOCUMENTS

| 2005/0259093 A1* | 11/2005 | Osame ................. G09G 3/3241 345/204 |
| 2009/0128534 A1* | 5/2009 | Fish ..................... G09G 3/3233 345/211 |
| 2010/0253666 A1 | 10/2010 | Yamamoto |
| 2013/0093737 A1* | 4/2013 | Ota ...................... G09G 3/3233 345/204 |
| 2016/0042692 A1 | 2/2016 | Ota et al. |

(Continued)

FOREIGN PATENT DOCUMENTS

| JP | 2006-011391 A | 1/2006 |
| JP | 2010-217661 A | 9/2010 |
| JP | 2010-243560 A | 10/2010 |

(Continued)

*Primary Examiner* — Jennifer Mehmood
*Assistant Examiner* — Ngan T. Pham-Lu
(74) *Attorney, Agent, or Firm* — Oliff PLC

(57) ABSTRACT

A transistor circuit outputs a drive current in accordance with a data signal. An OLED that is connected to the transistor circuit emits light with luminance corresponding to the drive current. A discharge transistor, when the OLED does not emit the light, is turned on to connect a discharge feeder line to a node at which the transistor circuit is connected to the OLED. An absolute value of a threshold voltage of the discharge transistor is lower than an absolute value of a threshold voltage of a drive transistor in the transistor circuit. When the data signal indicates zero, the discharge transistor can cause a flow of the drive current from the transistor circuit to bypass the OLED.

17 Claims, 13 Drawing Sheets

(56) References Cited

U.S. PATENT DOCUMENTS

2016/0217738 A1* 7/2016 Yamashita ........... G09G 3/3233

FOREIGN PATENT DOCUMENTS

| JP | 2013-088611 A | 5/2013 |
| JP | 2016-038425 A | 3/2016 |

* cited by examiner

PIXEL CIRCUIT, ELECTRO-OPTICAL DEVICE, AND ELECTRONIC APPARATUS

BACKGROUND

1. Technical Field

The present invention relates to a pixel circuit, an electro-optical device, and an electronic apparatus.

2. Related Art

To date, various electro-optical devices that include light emitting elements such as organic light emitting diodes (OLEDs) have been proposed. An electro-optical device of this type typically has pixel circuits in relation to pixels of an image to be displayed. These pixel circuits are disposed at the intersections of scan lines and data lines and each include a light emitting element and a transistor circuit. This transistor circuit supplies the light emitting element with a drive current whose magnitude is proportional to a data signal that indicates luminance of a corresponding light emitting element.

SUMMARY

Pixel circuits, as described above, usually need to create clear black images. For that purpose, when the data signal indicates zero, the transistor circuit in a pixel circuit has to completely stop supplying the drive current to the light emitting element so that the light emitting element does not emit light.

When no drive current is supplied to the light emitting element, however, a leakage current may still flow from the transistor circuit to the light emitting element. As a result, the light emitting element might emit weak light, causing the so-called black floating, which is a phenomenon in which a black image is not created clearly.

JP-A-2010-243560 discloses a technique for discharging electric charge from the connection node between a transistor circuit and a light emitting element when the light emitting element does not emit light. JP-A-2013-088611 discloses a technique for suppressing an occurrence of the black floating, in which a bypass element is provided between a reference potential line and an end of a light emitting element which is closer to a transistor circuit. When the light emitting element does not emit light, a leakage current flows from the transistor circuit to this bypass element.

Unfortunately, the former technique may fail to address the problem associated with the black floating, because pixel circuits in micro displays and other related displays have small-capacitance light emitting elements. While such a light emitting element is not emitting light, electric charge may be excessively accumulated in the capacitance of the light emitting element, and as a result the leakage current might flow through the light emitting element, causing the black floating. Furthermore, both of the above techniques are intended to cause the flow of a leakage current from the transistor circuit to bypass the light emitting element when the light emitting element does not emit light. However, the techniques may fail to suppress an occurrence of the black floating effectively when the light emitting element emits light.

An advantage of some aspects of the invention is that a pixel circuit, an electro-optical device, and an electronic apparatus are all effective in suppressing an occurrence of the black floating.

A pixel circuit according to a first aspect of the invention includes: a transistor circuit that outputs a drive current in accordance with a data signal; a light emitting element that is connected to the transistor circuit and emits light with luminance corresponding to the drive current; and a discharge section that, when the data signal indicates zero, causes a flow of the drive current to bypass the light emitting element.

According to this aspect, when the data signal indicates zero, the discharge section stops the drive current output from the transistor circuit from flowing to the light emitting element. Thus, this configuration is effective in suppressing an occurrence of the black floating.

It is preferable that the transistor circuit include a drive transistor that generates the drive current in accordance with the data signal. It is preferable that the discharge section include a discharge transistor that, when the light emitting element does not emit the light, is turned on to connect a discharge feeder line to a node at which the transistor circuit is connected to the light emitting element. It is preferable that an absolute value of a threshold voltage of the discharge transistor be lower than an absolute value of a threshold voltage of the drive transistor.

According to this aspect, the absolute value of the threshold voltage of the discharge transistor is set to be lower than the absolute value of the threshold voltage of the drive transistor. In this case, when the data signal indicates zero, the discharge transistor in an off state can drive a current that is larger in amount than the drive current output from the transistor circuit. Thus, this configuration is more effective in suppressing an occurrence of the black floating.

It is preferable that the discharge transistor have a shorter channel length than that of the drive transistor.

According to this aspect, when the data signal indicates zero, the discharge transistor in an off state can drive a current that is larger in amount than the drive current output from the transistor circuit. Thus, this configuration is more effective in suppressing an occurrence of the black floating.

It is preferable that the drive transistor be a P-channel transistor and that the discharge transistor be an N-channel transistor.

According to this aspect, the current output from the transistor circuit flows into the p well of the N-channel discharge transistor through its drain. By the amount of this current, the amount of a current bypassing the light emitting element and flowing through the discharge section can be increased. Thus, this configuration is more effective in suppressing an occurrence of the black floating.

It is preferable that a drain of the discharge transistor which is connected to the light emitting element have a wider area than that of a source of the discharge transistor.

According to this aspect, a larger amount of current can flow from the drain into the p well of the discharge transistor. Thus, this configuration is more effective in suppressing an occurrence of the black floating.

It is preferable that the transistor circuit include a light emission control transistor connected between the drive transistor and the light emitting element. It is preferable that the light emission control transistor be a P-channel transistor. It is preferable that a drain of the discharge transistor have a wider area than a total area of a drain and source of the light emission control transistor.

According to this aspect, the leakage current that flows from the n well to source of the P-channel light emission control transistor and the leakage current that flows from the n well to drain of the P-channel light emission control transistor through the pn junction are added to the current output from the transistor circuit. In addition, the area of the drain of the N-channel discharge transistor is set to be larger than the total area of the drain and source of the light emission control transistor. In this case, the current flowing from the drain into the p well of the discharge transistor is larger in amount than the leakage current flowing from the n well to the source and drain of the light emission control transistor through the pn junction. Thus, this configuration is more effective in suppressing an occurrence of the black floating.

It is preferable that the transistor circuit include a drive transistor that generates the drive current in accordance with the data signal. It is preferable that the discharge section include a discharge transistor that, when the light emitting element does not emit the light, is turned on to connect a discharge feeder line to a node at which the transistor circuit is connected to the light emitting element. It is preferable that the drive transistor be an enhancement type transistor and that the discharge transistor be a depletion type transistor.

According to this aspect, the drive transistor is an enhancement type transistor, and the discharge transistor is a depletion type transistor. When the data signal indicates zero, the discharge transistor in an off state can drive a current that is larger in amount than the drive current output from the transistor circuit. Thus, this configuration is more effective in suppressing an occurrence of the black floating.

An electro-optical device according to a second aspect includes the pixel circuit according to one of the above aspects.

According to this aspect, this configuration is effective in suppressing the black floating from occurring in the electro-optical device.

An electronic apparatus according to a third aspect includes the above electro-optical device. Examples of the electronic apparatus include a head mount display and a projector.

A pixel circuit according to a fourth aspect includes a transistor circuit that outputs a drive current in accordance with a data signal; a light emitting element that is connected to the transistor circuit and emits light with luminance corresponding to the drive current, the light emitting element; and in a light emission period, a discharge section that causes a flow of a part of the drive current.

A pixel circuit according to a fifth aspect includes: a transistor circuit that outputs a drive current in accordance with a data signal; a light emitting element that is connected to the transistor circuit and emits light with luminance corresponding to the drive current; and a discharge transistor that is turned off to cause a flow of a part of the drive current.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
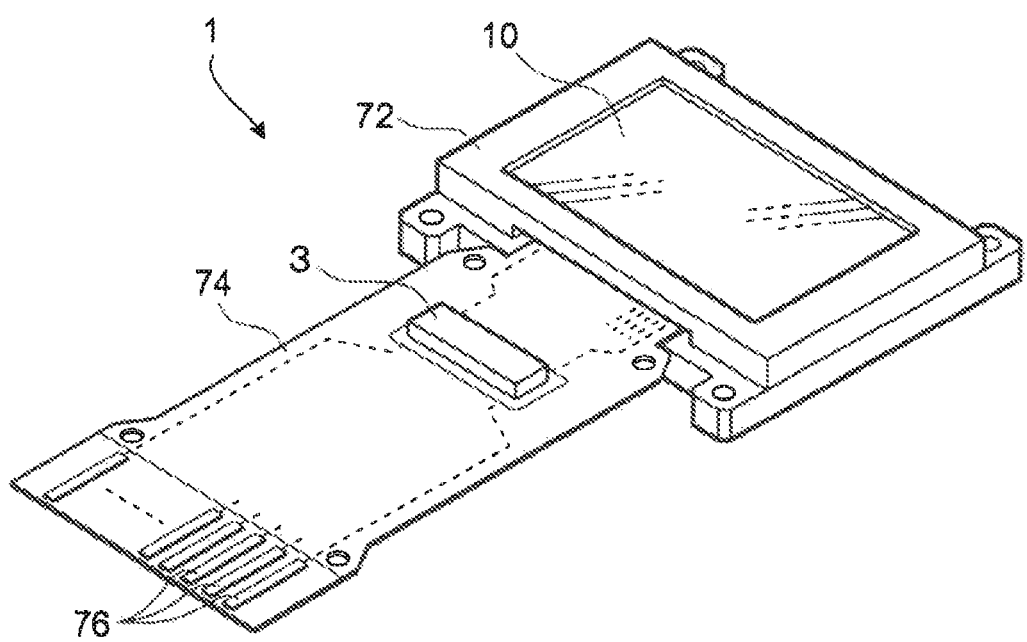
FIG. 1 is a perspective view of a configuration of an electro-optical device according to a first embodiment of the invention.

FIG. 1 is a perspective view of a configuration of an electro-optical device 1 according to a first embodiment of the invention. As an example, the electro-optical device 1 may be a micro display device in a head mount display (HMD) which displays images. As another example, the electro-optical device 1 may be an organic EL device in which a plurality of pixel circuits and drive circuits that drive the pixel circuits are mounted on a silicon substrate. Each pixel circuit has an organic light emitting diode (OLED), which is an example of a light emitting element.

The electro-optical device 1 includes a display panel 10 and a control circuit 3. The display panel 10 is mounted in a casing 72 having a frame and an opening in a display section. This display panel 10 is connected to an end of a flexible printed circuit (FPC) substrate 74. The control circuit 3 is mounted on the FPC substrate 74 by means of a chip on film (COF) technique. This control circuit 3 may be implemented using a semiconductor chip. The control circuit 3 is connected to an unillustrated upstream circuit through a plurality of terminals 76.

Figure 2:
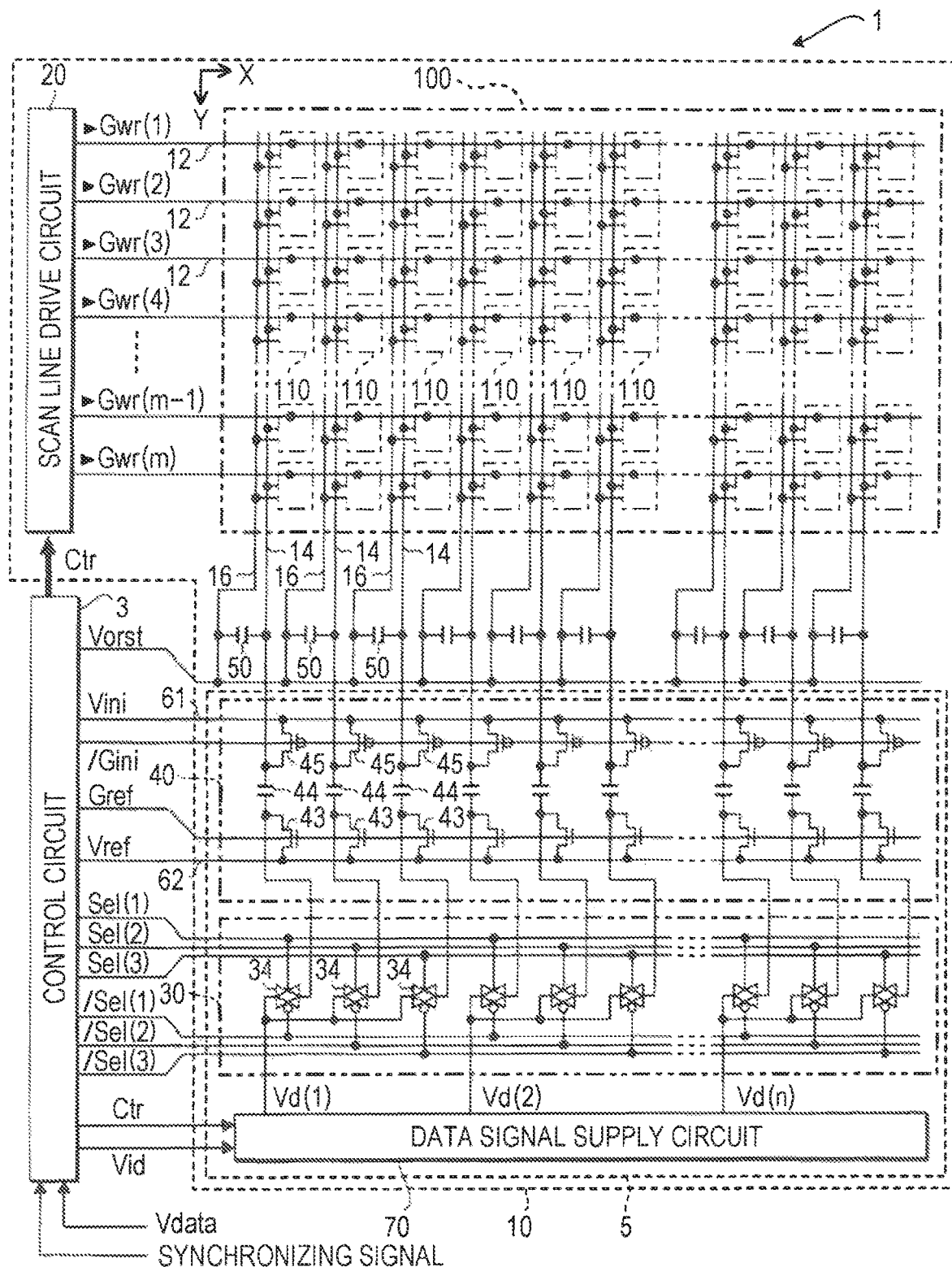
FIG. 2 is a block diagram illustrating a configuration of the electro-optical device in FIG. 1.

FIG. 2 is a block diagram illustrating a configuration of the electro-optical device 1. As described above, the display panel 10 and the control circuit 3 are mounted in the electro-optical device 1.

The upstream circuit supplies digital image data Vdata and a synchronizing signal to the control circuit 3; the image data Vdata and the synchronizing signal are synchronized together. The image data Vdata may be, for example 8-bit data that specifies gradation levels of the pixels in an image to be displayed on the display panel 10 by a display section 100 (described later). The synchronizing signal may contain a vertical synchronizing signal, a horizontal synchronizing signal, and a dot clock signal.

The control circuit 3 generates various control signals on the basis of the synchronizing signal and supplies these control signals to the display panel 10. More specifically, the control circuit 3 supplies control signals Ctr, a positive logic control signal Gref, and a negative logic control signal /Gini, control signals Sel(1), Sel(2), and Sel(3), /Sel(1), /Sel(2), and /Sel(3). The positive logic control signal Gref is equivalent to the logical inversion of the negative logic control signal /Gini. The control signal Sel(1) is equivalent to the logical inversion of the control signal /Sel(1). The control signal Sel(2) is equivalent to the logical inversion of the control signal /Sel(2). The control signal Sel(3) is equivalent to the logical inversion of the control signal /Sel(3). Each control signal Ctr contains a plurality of signals, including a pulse signal, a clock signal, and an enable signal. Hereinafter, the control signals Sel(1), Sel(2), and Sel(3) may be collectively referred to as the control signals Sel. Likewise, the control signals /Sel(1), /Sel(2), and /Sel(3) may be collectively referred to as the control signals /Sel.

The control circuit 3 includes a voltage generating circuit. This voltage generating circuit applies various electric potentials to the display panel 10. More specifically, the control circuit 3 applies a potential Vorst, an initial potential Vini, and a potential Vref to the display panel 10.

The control circuit 3 generates an analog image signal Vid on the basis of the image data Vdata. More specifically, the control circuit 3 has a lookup table in which a potential indicated by the image signal Vid is related to luminance of the light emitting elements in the display panel 10; the light emitting elements may be OLEDs 130 that will be described later. The control circuit 3 refers to the lookup table and then generates the image signal Vid indicating a potential related to the luminance of the light emitting elements which is specified by the image data Vdata. Then, the control circuit 3 supplies the image signal Vid to the display panel 10.

As illustrated in FIG. 2, the display panel 10 includes the display section 100, a data transfer line drive circuit 5, and a scan line drive circuit 20.

In the display section 100, a plurality of pixel circuits 110 are arranged in a matrix fashion and in relation to the pixels of an image to be displayed. More specifically, in the display section 100, m rows of scan lines 12 extend along the short side of the page of FIG. 2, and 3n columns of data lines 14 extend along the long side of the page. Out of these data lines 14, three data lines 14 make each group. The scan lines 12 and the data lines 14 are electrically isolated from each other. At the intersections between the scan lines 12 and the data lines 14 are the pixel circuits 110 provided. In this embodiment, thus, the pixel circuits 110 are arranged in the form of a matrix with m rows and 3n columns.

Each of the numbers m and n may be any natural number. To differentiate the individual rows in the matrices of the scan lines 12 and the pixel circuits 110, the rows may be referred to below as the first, second, third . . . (m−1)th, and m-th rows in the order from the upper side of the page of FIG. 2. Likewise, to differentiate the individual columns in the matrices of the data lines 14 and the pixel circuits 110, the columns may be referred to below as the first, second, third . . . (3n−1)th, and (3n)th columns in the order from the left side of the page of FIG. 2. For example, if any one of the groups made by the data lines 14 is denoted by a j-th group (j is any integer ranging from 1 to n), this j-th group contains the data lines 14 of (3j−2)th, (3j−1)th, and 3j-th columns.

Three pixel circuits 110 are provided at the intersections between a single scan line 12 and three data lines 14 in the same group. These pixel circuits 110 are related to three colors, namely, red, green, and blue and each form a dot of a color image to be displayed. In this embodiment, the OLEDs 130 emit red light, green light, and blue light, forming a single color dot in an additive color manner.

In this embodiment, along the data lines 14 are provided feeder lines 16, which serve as discharge feeder lines for individual columns. The control circuit 3 applies the potential Vorst to all the feeder lines 16 as a discharge potential. In addition, each column is provided with a capacitor 50. More specifically, first ends of the capacitors 50 are connected to the corresponding data lines 14, whereas second ends of the capacitors 50 are connected to the corresponding feeder lines 16. In short, each capacitor 50 functions as a second capacitor that retains a potential of a corresponding data line 14.

Each capacitor 50 preferably has a structure in which an insulator or a dielectric is formed between wires of a data line 14 and a feeder line 16.

Referring to FIG. 2, as an example, the capacitors 50 are provided outside the display section 100. As an alternative example, the capacitors 50 may be provided either inside the display section 100 or from the inside to outside of the display section 100. The capacitance of each capacitor 50 may be denoted by Cdt, which is not described in FIG. 2.

The data transfer line drive circuit 5 includes a demultiplexer 30, a data transfer circuit 40, and a data signal supply circuit 70. The data signal supply circuit 70 outputs data signals Vd(1), Vd(2) . . . Vd(n) to first, second . . . n-th blocks, respectively, in accordance with selection timings of the demultiplexer 30. Each of the data signals Vd(1), Vd(2) . . . Vd(n) indicates a potential ranging from a minimum potential Vmin to a maximum potential Vmax.

The scan line drive circuit 20 sequentially selects the plurality of pixel circuits 110 arranged in a matrix fashion and controls the operations of these pixel circuits 110. The scan line drive circuit 20 repeatedly sequentially selects the pixel circuits 110 row by row. More specifically, the scan line drive circuit 20 generates scan signals used to sequentially scan the scan lines 12 over a frame period 1F, in accordance with a control signal Ctr. The frame period 1F corresponds to a period over which the electro-optical device 1 displays a frame of an image. For example, if the vertical synchronizing signal contained in the synchronizing signal has a frequency of 120 Hz, the frame period 1F is approximately 8.3 ms, which is equivalent to one period of the vertical synchronizing signal. Hereinafter, scan signals supplied to the scan lines 12 on the first, second, third . . . (m−1)th, and m-th rows may be denoted by Gwr(1), Gwr(2), Gwr(3) . . . Gwr(m−1), and Gwr(m), respectively. In addition, the scan line drive circuit 20 causes each pixel circuit 110 to perform a current value setting operation and a light emitting operation. In the current value setting operation, each pixel circuit 110 sets a value of a drive current to be supplied to the OLED 130 within the frame period 1F between when a pixel circuit 110 is selected and this pixel circuit 110 is selected again. In the light emitting operation, each pixel circuit 110 supplies a current to the OLED 130 with an emission of light.

To control the operations of the pixel circuits 110 described above, the scan line drive circuit 20 generates, in addition to the scan signals Gwr(1) to Gwr(m), various control signals for respective rows in synchronization with the scan signals. Then, the scan line drive circuit 20 supplies the generated control signals to the display section 100. It should be noted that these control signals are not illustrated in FIG. 2.

The demultiplexer 30 includes a plurality of groups of transmission gates 34 provided on the respective columns. The demultiplexer 30 sequentially supplies data signals to the three rows in each group.

The transmission gates 34 on the (3j−2)th, (3j−1)th, and (3j)th columns which belong to the j-th group have a common input terminal to which the data signal Vd(j) is to be supplied.

When the control signal Sel(1) is at the H level, in other words, when the control signal /Sel(1) is at the L level, the transmission gate 34 on the leftmost column, or on the (3j−2)th column, in the j-th group is turned on to conduct electricity. Likewise, when the control signal Sel(2) is at the H level, in other words, when the control signal /Sel(2) is at the L level, the transmission gate 34 on the central column, or the (3j−1)th column, in the j-th group is turned on to conduct electricity. When the control signal Sel(3) is at the H level, in other words, when the control signal /Sel(3) is at the L level, the transmission gate 34 on the rightmost row, or the 3j-th row, in the j-th group is turned on to conduct electricity.

The data transfer circuit 40 includes a capacitor 44, a P-channel metal oxide semiconductor (MOS) transistor 45, and an N-channel MOS transistor 43 on each column. The data transfer circuit 40 shifts the potentials of the data signals output from the output terminals of the transmission gates 34 on the respective columns. A first end of each capacitor 44 is connected to both the data line 14 and the drain node of the P-channel MOS transistor 45 on a corresponding column, whereas a second end of each capacitor 44 is connected to both the output terminal of the transmission gate 34 and the drain node of the N-channel MOS transistor 43 on the corresponding column. In short, each capacitor 44 functions as a first capacitor having an end connected to the corresponding data line 14. The capacitance of each capacitor 44 is denoted by Crf1, which is not described in FIG. 2.

The source nodes of the P-channel MOS transistors 45 on the respective columns are connected to the feeder line 61 through which the potential Vini is applied as the initial potential, whereas the gate nodes of the P-channel MOS transistors 45 on the respective rows are supplied with the control signal /Gini. Thus, the P-channel MOS transistors 45 electrically connect the data lines 14 to the feeder line 61 when the control signal /Gini is at the L level and electrically disconnect the data lines 14 from the feeder line 61 when the control signal /Gini is at the H level.

The source nodes of the N-channel MOS transistors 43 on the respective columns are connected to a feeder line 62 through which the potential Vref is applied as a predetermined potential, whereas the gate nodes of the N-channel MOS transistors 43 on the respective rows are supplied with the control signal Gref. In short, the N-channel MOS transistors 43 electrically connect the second ends, or nodes h, of the capacitors 44 to a feeder line 62 when the control signal Gref is at the H level and electrically disconnect the nodes h of the capacitors 44 from the feeder line 62 when the control signal Gref is at the L level.

For the sake of convenience, in this embodiment, the scan line drive circuit 20, the demultiplexer 30, and the data transfer circuit 40 are separated from one another; however, the scan line drive circuit 20, the demultiplexer 30, and the data transfer circuit 40 may be integrated to constitute a single drive circuit that drives the pixel circuits 110.

Next, the pixel circuits 110 will be described below with reference to FIG. 3. All the pixel circuits 110 have substantially the same electrical configuration. Therefore, the pixel circuit 110 on the i-th row and the (3j−2)th column which is positioned on the leftmost column in the J-th group is taken as an example and will be described below. The number i is used to designate a row on which any array of pixel circuits 110 are arranged. The number i may be any integer ranging from 1 to m.

Figure 3:
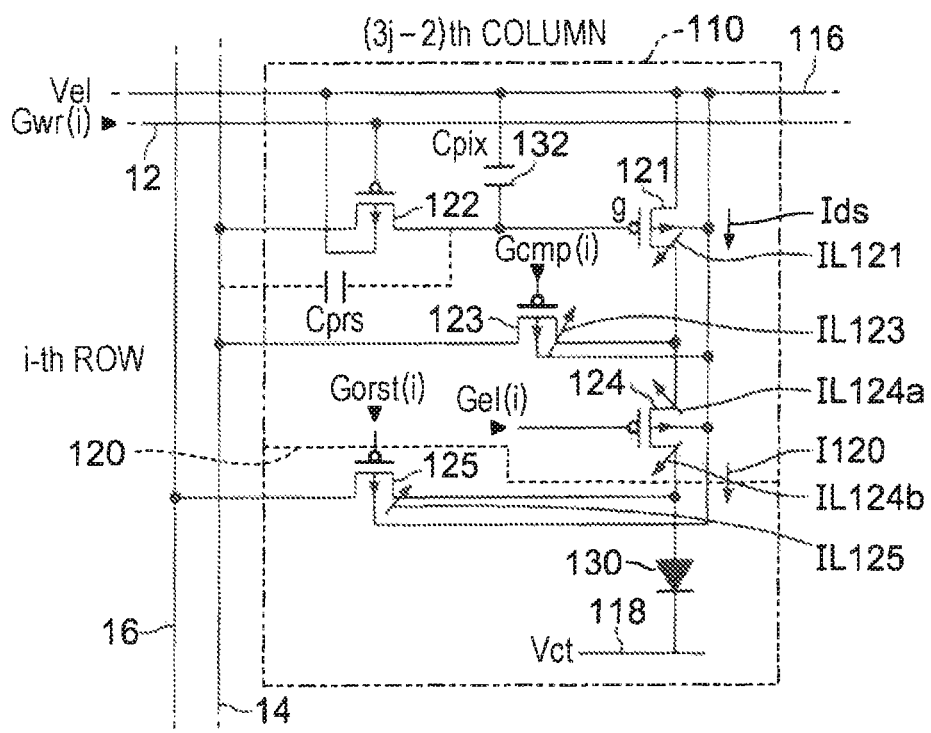
FIG. 3 is a circuit diagram illustrating a configuration of a pixel circuit in the electro-optical device.

As illustrated in FIG. 3, the pixel circuit 110 includes P-channel MOS transistors 121 to 125, the OLED 130, and a capacitor 132. The pixel circuit 110 is supplied with the scan signal Gwr(i) and control signals Gel(i), Gcmp(i), and Gorst(i). The scan signal Gwr(i) and the control signals Gel(i), Gcmp(i), and Gorst(i) are supplied from the scan line drive circuit 20 to the pixel circuits 110 on the i-th row. Thus, the scan signal Gwr(i) and the control signals Gel(i), Gcmp (i), and Gorst(i) are supplied not only to the pixel circuit 110 on the i-th row and the (3j−2)th column but also to the other pixel circuits 110 on the i-th row.

In the pixel circuit 110 on the i-th row and the (3j−2)th column, the gate node of the P-channel MOS transistor 122 is connected to the scan line 12 on the i-th row. In addition, one of the drain and source nodes of the P-channel MOS transistor 122 is connected to the data line 14 on the (3j−2)th column, whereas the other of the drain and source nodes of the P-channel MOS transistor 122 is connected to a gate node g of the P-channel MOS transistor 121, a first end of the capacitor 132, and the drain node of the P-channel MOS transistor 123. This P-channel MOS transistor 122 serves as a current value setting transistor that sets a value of a current to be driven by the P-channel MOS transistor 121 by supplying the data signal received through the data line 14 to the gate node of the P-channel MOS transistor 121. The gate node of the P-channel MOS transistor 121 is denoted by g so as to be differentiable from other nodes.

The P-channel MOS transistor 121 serves as a drive transistor that generates a drive current to be supplied to the OLED 130. The source node of the P-channel MOS transistor 121 is connected to the feeder line 116, whereas the drain node of the P-channel MOS transistor 121 is connected to both the source nodes of the P-channel MOS transistor 123 and the P-channel MOS transistor 124. Through the feeder line 116, a potential Vel is applied to the pixel circuit 110; the potential Vel corresponds to the high potential of the supply voltage.

The P-channel MOS transistor 123 serves as an offset transistor that offsets the threshold voltage of the P-channel MOS transistor 121. The drain node of the P-channel MOS transistor 123 is connected to the data line 14. The gate node of the P-channel MOS transistor 123 is supplied with the control signal Gcmp(i).

The gate node of the P-channel MOS transistor 124 is supplied with the control signal Gel(i), whereas the drain node of the P-channel MOS transistor 124 is connected to both the source node of the P-channel MOS transistor 125 and the anode of the OLED 130. The P-channel MOS transistor 124 is provided on a path along which the drive current is to be supplied to the OLED 130. This P-channel MOS transistor 124 serves as a light emission control transistor that controls a light emission period of the OLED 130. More specifically, the P-channel MOS transistor 124 is turned on to cause the OLED 130 to emit light and turned off to stop the OLED 130 from emitting the light.

The P-channel MOS transistors 121 to 124 described above constitute a transistor circuit 120 that supplies the drive current to the OLED 130.

The gate node of the P-channel MOS transistor 125 is supplied with the control signal Gorst(i) for the i-th row, whereas the drain node of the P-channel MOS transistor 125 is connected to the feeder line 16 on the (3j−2)th column and kept at the potential Vorst. This P-channel MOS transistor 125 serves as a discharge transistor that is turned on to connect the anode of the OLED 130 to the feeder line 16 when the OLED 130 does not emit light. The P-channel MOS transistor 125, which serves as the discharge transistor in this embodiment, functions as a "discharge section" herein, which causes the flow of the drive current output from the transistor circuit 120 to bypass the OLED 130 when the data signal indicates zero during the light emission period.

A second end of the capacitor 132 is connected to the feeder line 116. Thus, the capacitor 132 maintains a voltage between the source and drain of the P-channel MOS transistor 121. When the capacitance of the capacitor 132 is denoted by Cpix, a capacitance Cdt of each capacitor 50, a capacitance Crf1 of each capacitor 44, and the capacitance Cpix of the capacitor 132 are set so as to satisfy the relationship:

$$Cdt > Crf1 >> Cpix \quad (1).$$

In short, the capacitance Cdt is set to be larger than the capacitance Crf1, and the capacitance Cpix is set to be much smaller than the capacitances Cdt and Crf1.

The capacitor 132 may be implemented using a parasitic capacitance at the gate node g of the P-channel MOS transistor 121. Alternatively, the capacitor 132 may be implemented using a capacitance between different conducting layers formed on a silicon substrate with an insulating layer therebetween.

In this embodiment, the electro-optical device 1 is formed on the silicon substrate. Therefore, a substrate potential of the P-channel MOS transistors 121 to 125 is the potential Vel.

The anode of the OLED 130 corresponds to a pixel electrode provided uniquely in each pixel circuit 110. The cathode of the OLED 130 corresponds to a common electrode 118 shared by all the pixel circuits 110. This cathode is kept at a potential Vct, which corresponds to the low potential of the supply voltage.

The OLED 130 is an element having a structure in which a white organic EL layer is formed between an anode and a light transmissive cathode on the silicon substrate. In addition, the surface of the OLED 130 on the cathode side from which light is to be output is covered with a red, green, or blue color filter.

When a current flows from the anode to cathode of the OLED 130 described above, holes injected from the anode are recoupled to electrons injected from the cathode in the organic EL layer, thereby generating exciton. As a result, the OLED 130 emits white light. This white light passes through the cathode positioned opposite the silicon substrate or the anode, and then is changed into red light, green light, or blue light by the color filter. After that, the resultant light is observed by a viewer.

The configuration in this embodiment, when the P-channel MOS transistor 125 is turned off during the light emission period, allows a large amount of off-state current Ioff_orst to flow through the P-channel MOS transistor 125 that serves as the discharge transistor. This configuration is effective in suppressing the black floating from occurring when the electro-optical device 1 displays a black image. Details of the configuration will be described below.

When the OLED 130 emits light, the data signal indicating zero, which is an instruction of displaying a back image, is supplied to the pixel circuit 110. In response, a gate-source voltage Vgs corresponding to the threshold voltage of the P-channel MOS transistor 121 is applied to the P-channel MOS transistor 121, as will be described later. As a result, the P-channel MOS transistor 121 operates in the subthreshold region. Thus, a current I120 output from the transistor circuit 120 contains a drain current Ids of the P-channel MOS transistor 121 operating in the subthreshold region.

Figure 4:
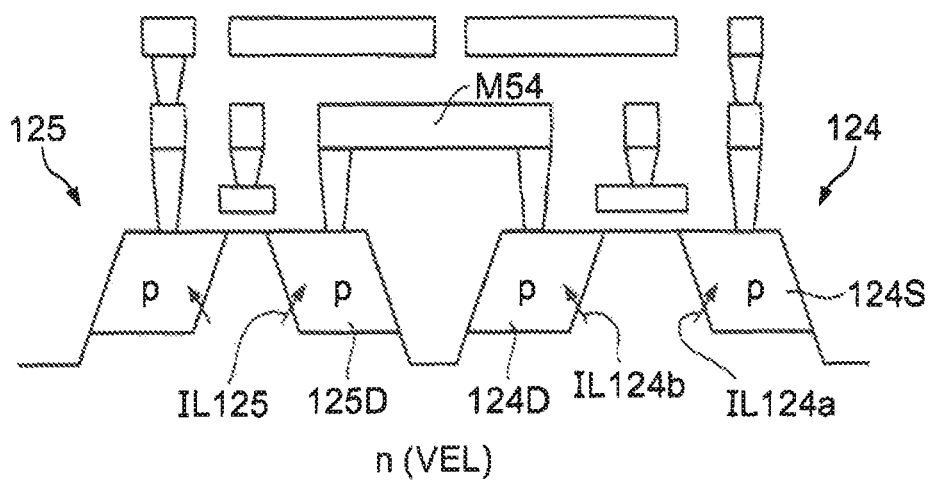
FIG. 4 is a cross-sectional view of a configuration of the light emission control transistor and the discharge transistor in the pixel circuit in FIG. 3.

The current I120 output from the transistor circuit 120 may also contain other currents. FIG. 4 is a cross-sectional view of a configuration of the P-channel MOS transistors 124 and 125 in this embodiment. As illustrated in FIG. 4, each transistor in the pixel circuit 110 has a shallow trench isolation (STI) structure. A source 124S and drain 124D of the P-channel MOS transistor 124 are formed in an n well to which the highest potential VEL is to be applied. In this structure, the P-channel MOS transistor 124 generates leakage currents IL124a and IL124b. The leakage current IL124a flows from the n well at the potential VEL to the source 124S through the pn junction therebetween; the leakage current IL124b flows from the n well at the potential VEL to the drain 124D through the pn junction. Likewise, the P-channel MOS transistor 121 generates a leakage current IL121; the P-channel MOS transistor 123 generates a leakage current IL123. In short, when the data signal indicates zero, the current I120 output from the transistor circuit 120 contains the drain current Ids of the P-channel MOS transistor 121 operating in the subthreshold region, as well as the leakage current IL121 generated in the P-channel MOS transistor 121, the leakage current IL123 generated in the P-channel MOS transistor 123, and the leakage currents IL124a and IL124b generated in the transistor 124.

As illustrated in FIG. 4, the P-channel MOS transistor 125 also generates a leakage current IL125 flowing from the n well at the potential VEL to the drain 125D. In this structure, the drain 125D of the P-channel MOS transistor 125 is connected to the drain 124D of the P-channel MOS transistor 124 by a metal wire M54, which is connected to the anode of the OLED 130 (see FIG. 3). In some instances, in addition to the current output from the transistor circuit 120, the leakage current IL125 of the P-channel MOS transistor 125 may flow to the OLED 130 unless any measures are taken.

In this embodiment, however, when the data signal indicates zero, the off-state current Ioff_orst generated in the P-channel MOS transistor 125 in the off state is set to be larger in amount than the sum (I120+IL125) of the current I120 output from the transistor circuit 120 and the leakage current IL125 of the P-channel MOS transistor 125 itself.

By setting the off-state current Ioff_orst in this manner, all the current I120 output from the transistor circuit 120 can be caused to flow to the feeder line 16 through the P-channel MOS transistor 125 when the data signal indicates zero while the OLED 130 is emitting light. In this way, an occurrence of the black floating is suppressed.

To set the off-state current Ioff_orst to be larger in amount than the sum of the leakage currents I120 and IL125, this embodiment takes the following measures.

In this embodiment, the absolute value of the threshold voltage of the P-channel MOS transistor 125 serving as the discharge transistor is set to be smaller than that of the P-channel MOS transistor 121 serving as the drive transistor.

By setting both threshold voltages in this manner, the off-state current Ioff_orst can be increased.

Figure 5:
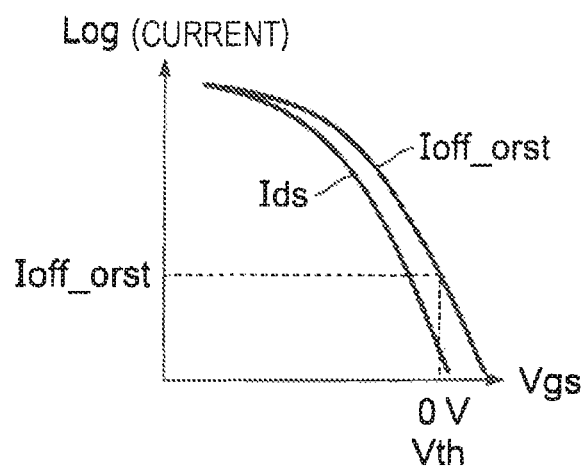
FIG. 5 is a graph showing current characteristics of the drive transistor and the discharge transistor in the pixel circuit.

FIG. 5 is a graph showing current characteristics of the P-channel MOS transistor 121 serving as the drive transistor and the P-channel MOS transistor 125 serving as the discharge transistor. In this example, the P-channel MOS transistor 125 has a lower threshold voltage than that of the P-channel MOS transistor 121. In the graph of FIG. 5, the horizontal axis represents gate-source voltages Vgs of the P-channel MOS transistors 121 and 125; the vertical axis represents the logarithmic values of the drain currents of the P-channel MOS transistors 121 and 125. The gate-source voltage of the P-channel MOS transistor 125 is set to 0 V over the light emission period. When the data signal indicates zero during the light emission period, the gate-source voltage Vgs equivalent to the threshold voltage Vth is applied to the P-channel MOS transistor 121. Therefore, as can be found from FIG. 5, the horizontal axes related to the gate-source voltages Vgs of the P-channel MOS transistors 121 and 125 are shifted from each other at the point where the gate-source voltage Vgs of the P-channel MOS transistor 125 becomes 0 V, so that the gate-source voltage Vgs of the P-channel MOS transistor 121 equals the threshold voltage Vth.

The graph of FIG. 5 demonstrates that, when the threshold voltage of the P-channel MOS transistor 125 is lowered, the off-state current Ioff_orst generated in the P-channel MOS transistor 125 in the off state (Vgs=0 V) during the light emission period is larger than the current Ids (Vth) driven by the P-channel MOS transistor 121 in the subthreshold region.

As needed, the P-channel MOS transistor 121 may be an enhancement type transistor having a negative threshold voltage, and the P-channel MOS transistor 125 may be a depletion type transistor having a positive threshold voltage. In this case, the P-channel MOS transistor 125 can drive a larger amount of current when its gate-source voltage Vgs is 0 V. Thus, this configuration is more effective in suppressing an occurrence of the black floating.

Figure 6:
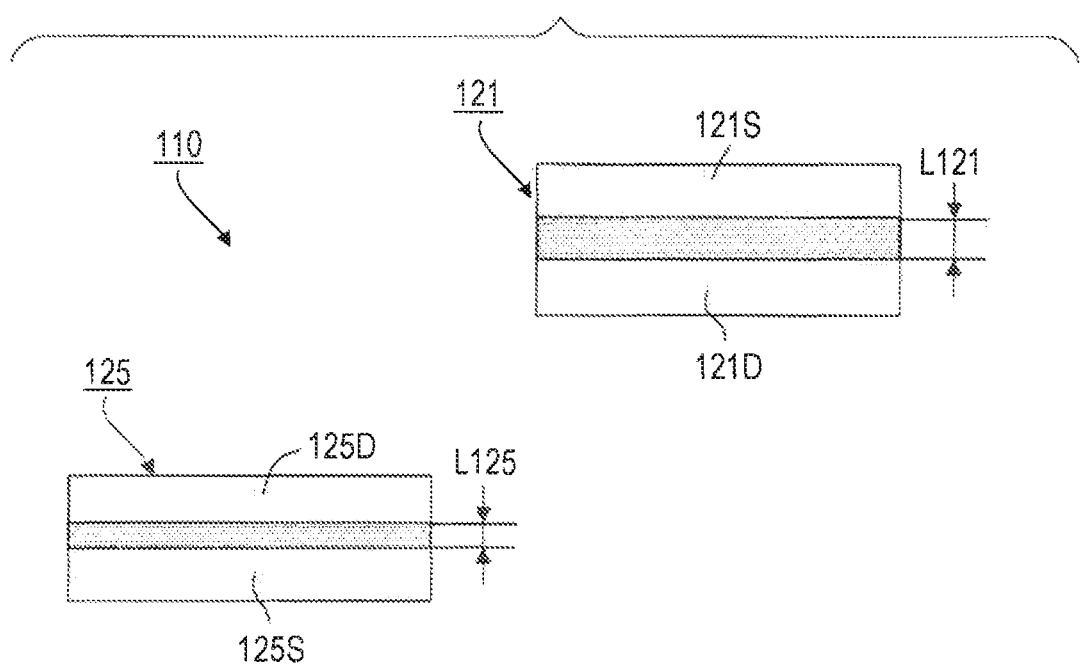
FIG. 6 is plan views of examples of the drive transistor and the discharge transistor in the pixel circuit.

In this embodiment, as illustrated in FIG. 6, a channel length L125 between a source 125S and the drain 125D of the P-channel MOS transistor 125 is set to be shorter than a channel length L121 between a source 121S and the drain 121D of the P-channel MOS transistor 121. By setting the channel lengths L125 and L121 in this manner, the threshold voltage of the P-channel MOS transistor 125 can be lowered due to the short channel effect. As a result, the off-state current Ioff_orst generated in the P-channel MOS transistor 125 in the off state (Vgs is 0 V) can be increased. The above-described configurations are those employed by this embodiment.

Figure 7:
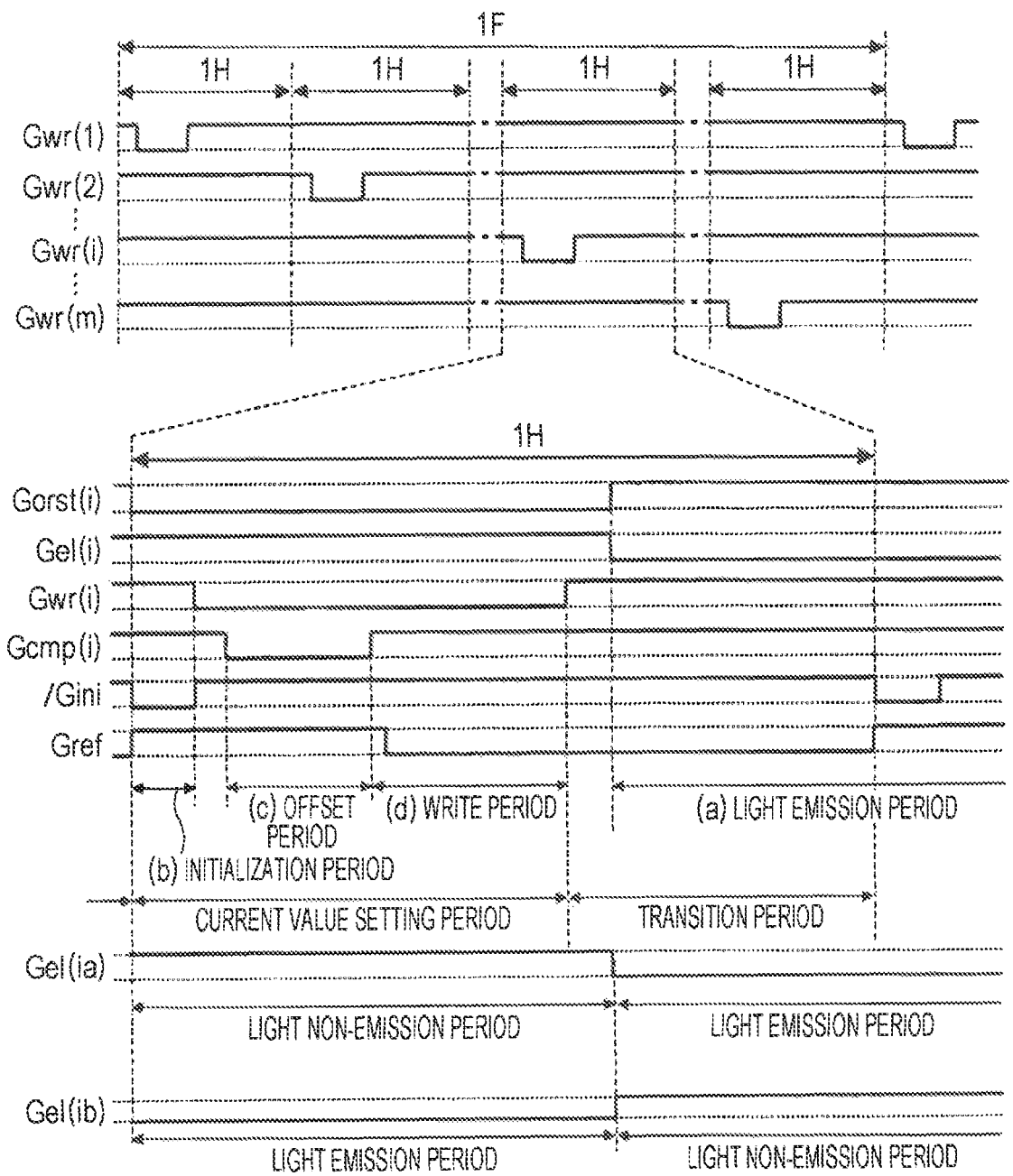
FIG. 7 is a timing chart of an operation of the electro-optical device.

Next, an operation of the electro-optical device 1 in this embodiment will be described below. FIG. 7 is a timing chart of the operation of the electro-optical device 1. As indicated by this timing chart, the scan signals Gwr(1) to Gwr(m) are sequentially switched to the L level during the frame period 1F. The scan lines 12 on the first to m-th rows are thereby sequentially scanned. The time interval between the selections of one and the next one of the plurality of scan lines 12 corresponds to a horizontal scanning period 1H. In this example, the frame period 1F contains an m number of horizontal scanning periods 1H.

Over every horizontal scanning period 1H, the pixel circuits 110 on each row perform the same operation. For this reason, a description will be given below regarding only the case where the pixel circuit 110 on the i-th row and the (3j−2)th column operates over the horizontal scanning period 1H in which the scan line 12 on the i-th row is horizontally scanned.

In this embodiment, a cycle of an initialization period, an offset period, a write period, and a light emission period is generated within the frame period 1F. In FIG. 7 illustrates a first cycle of (b) the initialization period, (c) the offset period, (d) the write period, and (a) the light emission period within the frame period 1F.

The time interval between the start of the initialization period and the end of the write period corresponds to a current value setting period, in which each pixel circuit 110 on the selected scan line 12 sets a value of its drive current. In this example, the current value setting period contains the initialization period, the offset period, and the write period; however, the current value setting period may have any other configuration. Within the horizontal scanning period (1H), the periods other than the current value setting period corresponds to transition periods. In this embodiment, the scan line drive circuit 20 causes the OLEDs 130 to transit between the light emission state and the light non-emission state over the transition periods, in order to adjust luminance of the entire screen.

Figure 8:
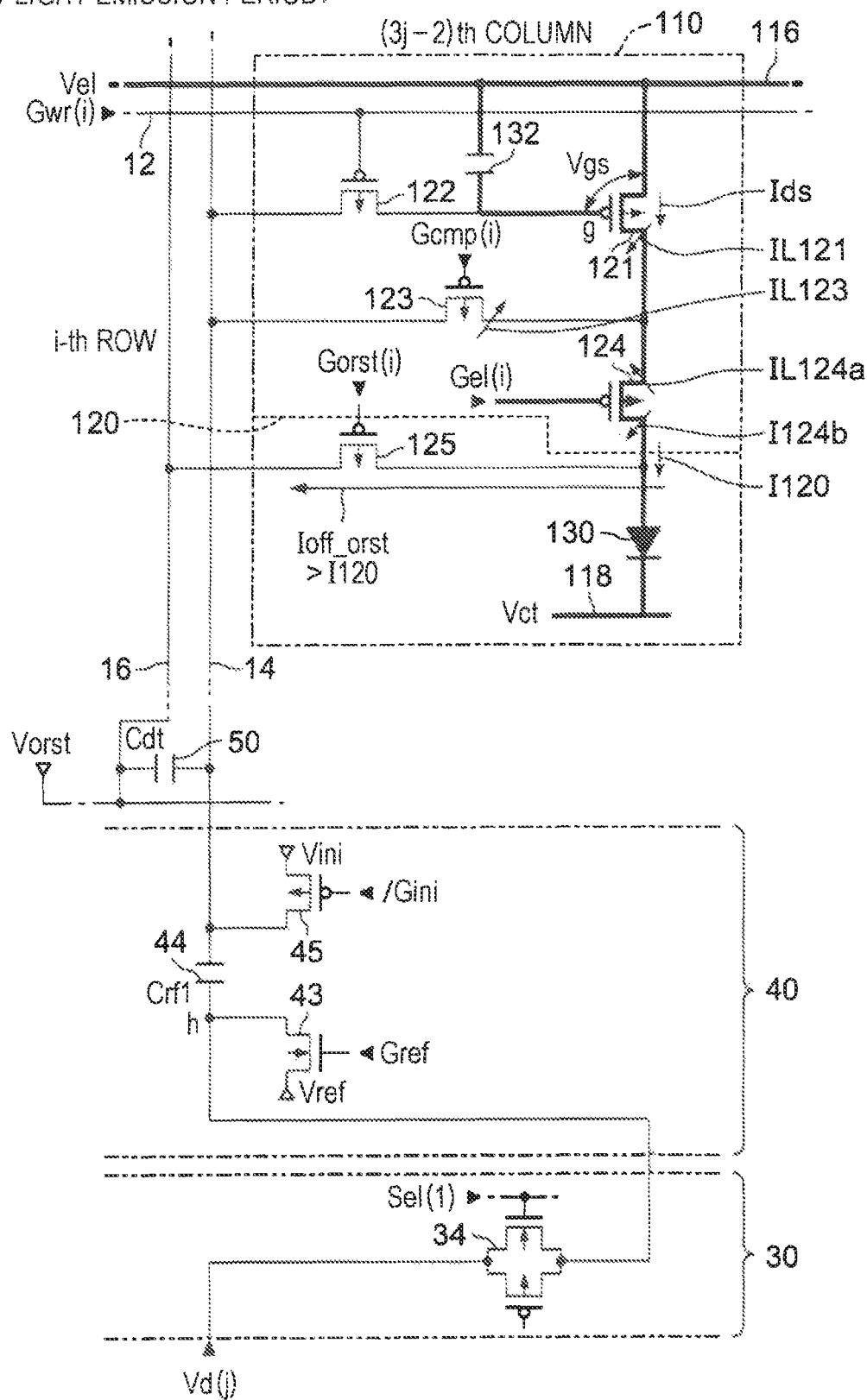
FIG. 8 is a circuit diagram for use in explaining an operation of the electro-optical device during a light emission period.
Figure 9:
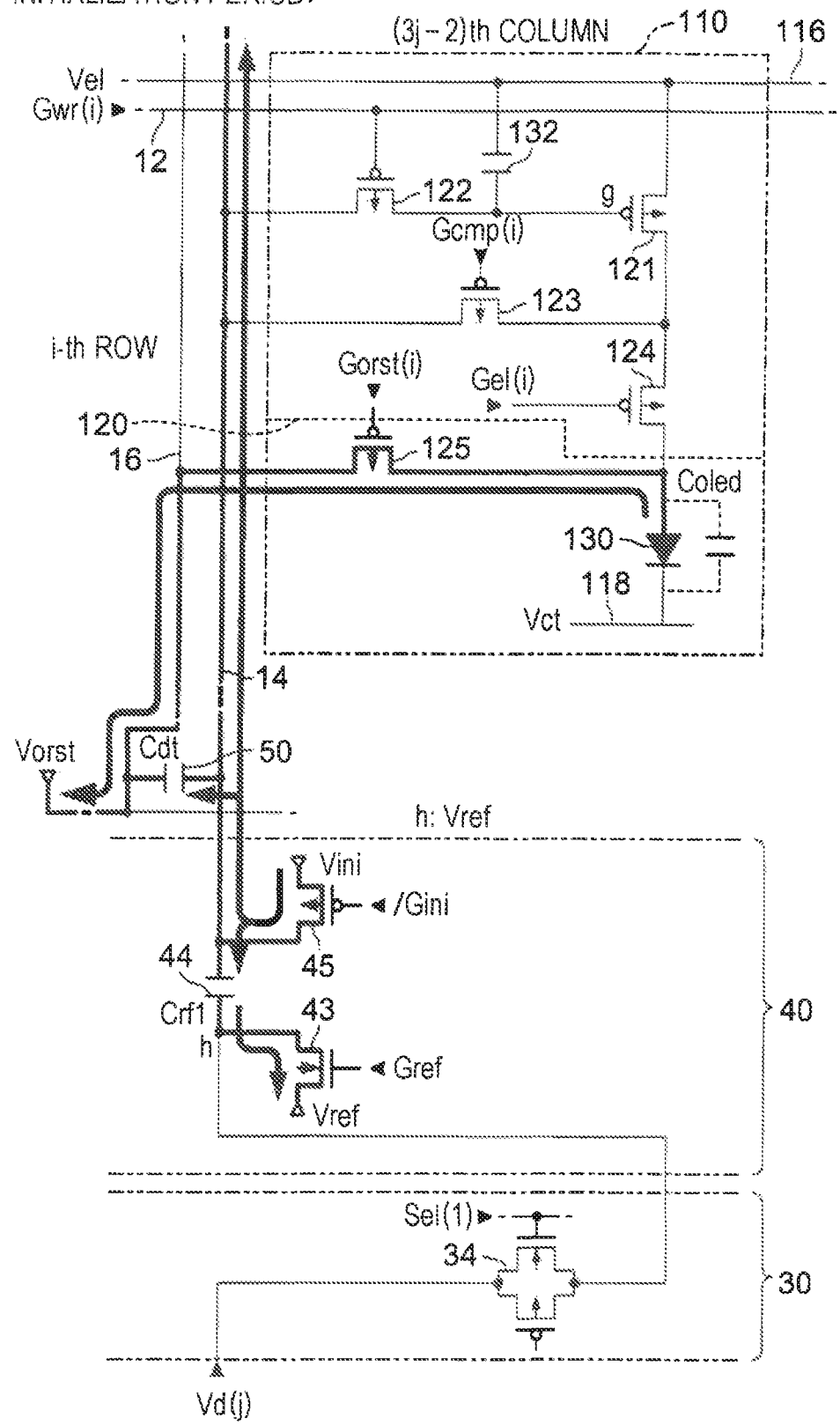
FIG. 9 is a circuit diagram for use in explaining an operation of the electro-optical device during an initialization period.
Figure 10:
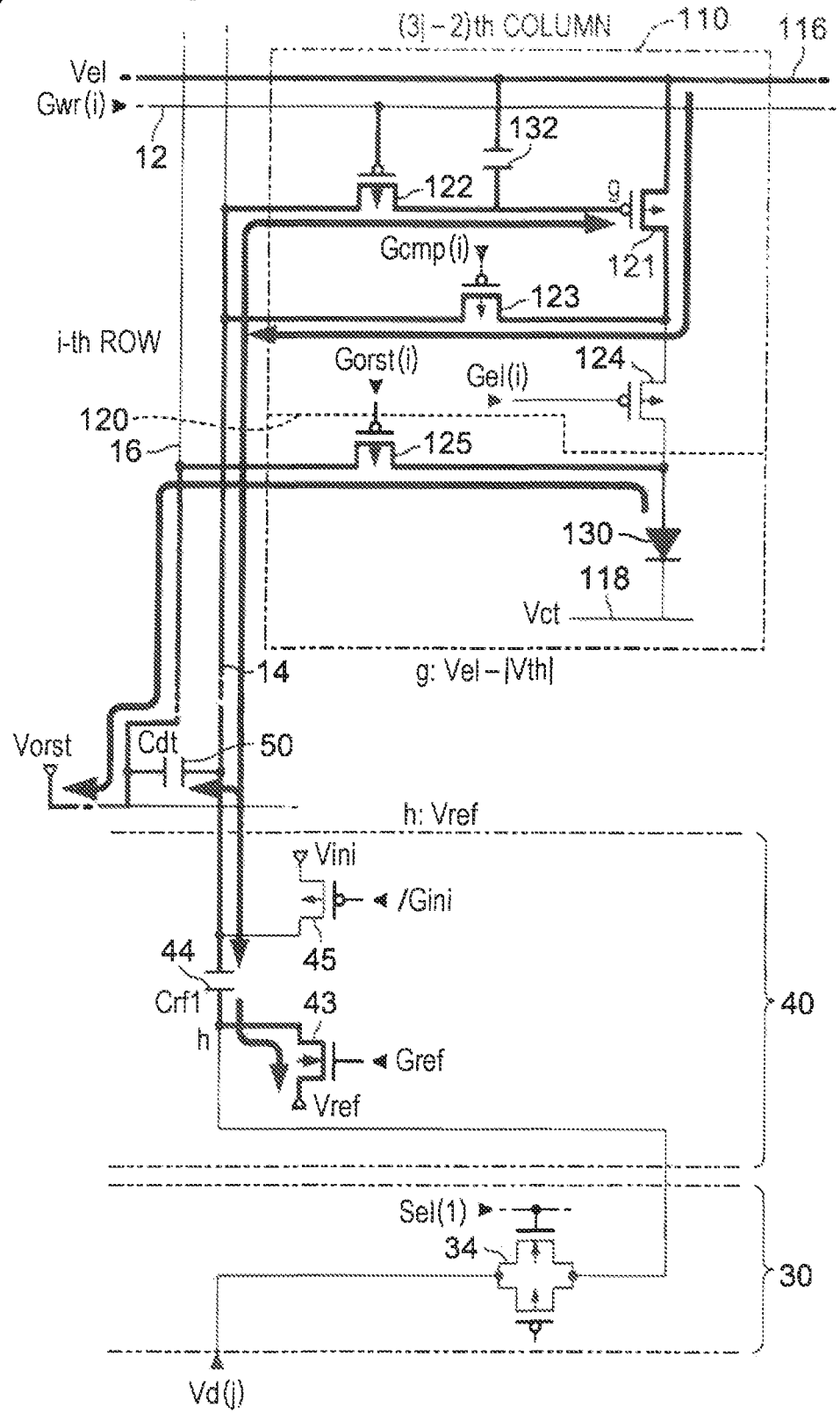
FIG. 10 is a circuit diagram for use in explaining an operation of the electro-optical device during an offset period.
Figure 11:
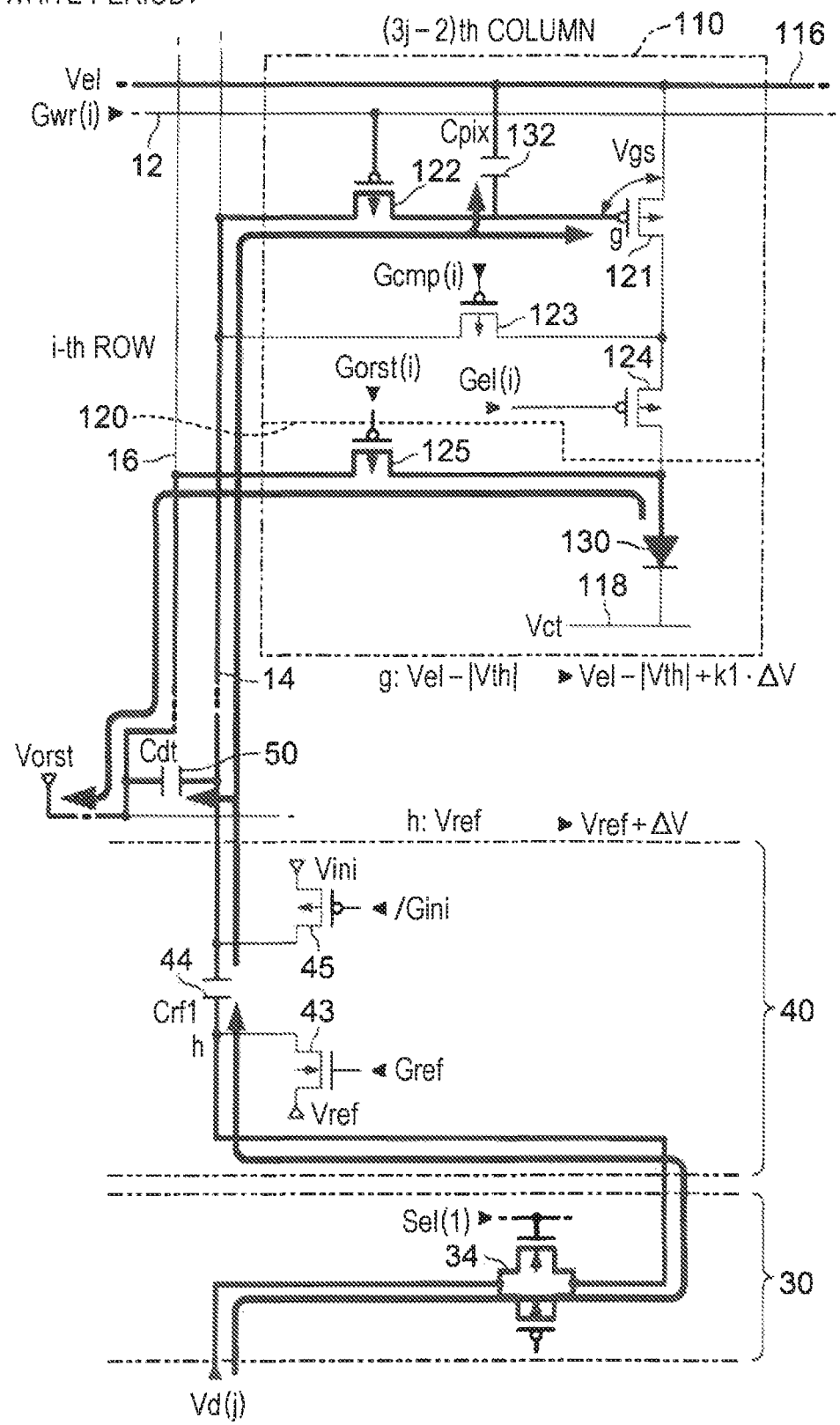
FIG. 11 is a circuit diagram for use in explaining an operation of the electro-optical device during a write period.

FIG. 8 illustrates an operating state of the pixel circuit 110 on the i-th row and the (3j−2)th column over the (a) light emission period. FIG. 9 illustrates an operating state over the (b) initialization period. FIG. 10 illustrates an operating state over the (c) offset period. FIG. 11 illustrates an operating state over the (d) write period. In each of FIGS. 8 to 11, the current routes in the pixel circuit 110 which are regarded as being important for the explanation of its operation are indicated by thick lines.

Light Emission Period

As described above, the initialization period, the offset period, and the write period constitute the current value setting period. In this current value setting period, each pixel circuit 110 operates in such a way that the OLED 130 emits light of an appropriate luminance according to the data signal over the light emission period. To understand the operations of the pixel circuit 110 in the initialization, offset, and write periods, it is necessary to understand an operation of the pixel circuit 110 in the light emission period. For this reason, the operation of the pixel circuit 110 in the light emission period will be described first.

As illustrated in FIG. 7, the scan signal Gwr(i) is at the H level over the light emission period in which the pixels on the i-th row emit light. In addition, the control signal Gel(i) is at the L level, and the control signals Gorst(i) and Gcmp(i) are at the H level.

In the pixel circuit 110 on the i-th row and the (3j−2) column, as illustrated in FIG. 8, the P-channel MOS transistor 124 is turned on, and the P-channel MOS transistors 122, 123, and 125 are turned off. As a result, the P-channel MOS transistor 121 supplies the OLED 130 with the current Ids according to the gate-source voltage Vgs.

Over the light emission period, in this embodiment, the gate-source voltage Vgs of the P-channel MOS transistor 121 is shifted from its threshold voltage in accordance with the potential of the data signal, as a result of the operations in the initialization, offset, and write periods, details of which will be described later. Thus, with its threshold voltage offset, the P-channel MOS transistor 121 supplies the OLED 130 with a current according to a gradation level over the light emission period.

When the data signal indicates zero, which instructs a black display, during the light emission period, the gate-source voltage Vgs of the P-channel MOS transistor 121 becomes equal to its threshold voltage. As a result, the transistor circuit 120 outputs the current I120 containing the drain current of the P-channel MOS transistor 121 operating in the subthreshold region and the leakage currents of the P-channel MOS transistors 121 and 123. Simultaneously, the P-channel MOS transistor 125 also generates a leakage current. In this embodiment, however, the off-state current Ioff_orst that exceeds the total of the current I120 output from the transistor circuit 120 and the leakage current of the P-channel MOS transistor 125 flows through the P-channel MOS transistor 125. Thus, no current flows through the OLED 130 upon the display of the black display. Consequently, this embodiment is effective in suppressing an occurrence of the black floating.

Initialization Period

When the scan line 12 on the i-th row is horizontally scanned, the initialization period (b) comes first. Over this initialization period, the scan signal Gwr(i) is at the H level. In addition, the control signal Gel(i) and Gcmp(i) are the at H level, and the control signal Gorst(i) is at the L level.

In the pixel circuit 110 on the i-th row and the (3j−2) column, as illustrated in FIG. 9, the P-channel MOS transistor 124 is turned off, and the P-channel MOS transistors 122, 123, and 125 are turned on. As a result, no current flows along the route from the P-channel MOS transistor 121 to the OLED 130, and the anode of the OLED 130 is reset to the potential Vorst.

As described above, the OLED 130 has the configuration in which the organic EL layer is formed between the anode and the cathode. Therefore, between the anode and the cathode is a parasitic capacitance Coled present, as indicated by the broken line in FIG. 9. While the current is flowing through the OLED 130 during the light emission period, the voltage between the anode and cathode of the OLED 130 is maintained by the parasitic capacitance Coled. In this embodiment, however, this voltage is reset in response to the turn-on of the P-channel MOS transistor 125 over the initialization period. This scheme reduces the influence of the voltage maintained by the parasitic capacitance Coled on the OLED 130 when the current next flows through the OLED 130 during the following light emission period.

For example, if the voltage between the anode and cathode of the OLED 130 is not reset, when the display panel 10 changes from a high-luminance state into a low-luminance state, a high voltage may be maintained between the anode and cathode of the OLED 130. Thus, even when the P-channel MOS transistor 121 attempts to supply a small amount of current to the OLED 130, an overcurrent may flow through the OLED 130, hindering the display panel 10 from entering the low-luminance state. In this embodiment, however, the potential at the anode of the OLED 130 is reset in response to the turn-on of the P-channel MOS transistor 125; therefore, a color production of the electro-optical device 1 can be enhanced when the display panel 10 is in the low-luminance state.

In this embodiment, the difference between the potential Vorst and the potential Vct at the common electrode 118 is set to be lower than the threshold voltage of the OLED 130. Therefore, the OLED 130 is maintained in an off state, or in a light non-emission state, over the initialization period as well as over the following offset and write periods.

Over the initialization period, the control signal /Gini is at the L level, and the control signal Gref is at the H level. In response, the P-channel MOS transistors 43 and 45 in the data transfer circuit 40 are turned on, as illustrated in FIG. 9. As a result, the data line 14 connected to a first end of the capacitor 44 is reset to the potential Vini, and a node h at a second end of the capacitor 44 is reset to the potential Vref.

In this embodiment, the potential Vini is set such that the difference (Vel−Vini) between the potential Vel and the potential Vini exceeds the absolute value |Vth| of the threshold voltage Vth of the P-channel MOS transistor 121. In this case, the threshold voltage Vth of the P-channel MOS transistor 121 has a negative value relative to the potential at the source node. Thus, for the purpose of helping an understanding of the magnitude relationship, the threshold voltage is represented by an absolute value |Vth|.

In this embodiment, the potential Vref is set such that the potential at the node h increases during the following the write period, relative to the potentials that the data signals Vd(1) to Vd(n) may have. As an example, the potential Vref may be set to be lower than the minimum voltage Vmin.

Offset Period

While the scan line 12 on the i-th row is being horizontally scanned, the offset period (c) comes after the initialization period (b). Over this offset period, the scan signal Gwr(i) and the control signal Gcmp(i) are switched to the L level. The control signal Gref is kept at the H level. The control signal /Gini is switched to the H level.

As a result, as illustrated in FIG. 10, in the data transfer circuit 40, the N-channel MOS transistor 43 is turned on, and the P-channel MOS transistor 45 is turned off. The node h is thereby fixed at the potential Vref. In the pixel circuit 110 on the i-th row and the (3j−2) column, the P-channel MOS transistor 122 is turned on. In response, the gate node g gets electrically connected to the data line 14. The gate node g is set to the potential Vini at the initial stage of the offset period.

During the offset period, the P-channel MOS transistor 123 is turned on. The gate node g of the P-channel MOS transistor 121 thereby gets connected to the drain node of the P-channel MOS transistor 121 through the P-channel MOS transistors 122 and 123, making a diode connection. As a result, the drain current flows through the P-channel MOS transistor 121, charging the gate node g and the data line 14. More specifically, the current flows along the route on which the feeder line 16, the P-channel MOS transistors 121 and 123, the data line 14 on the (3j−2) column, the P-channel MOS transistor 122, and the gate node g are disposed in this order. In this case, the potential on the data line 14 and at the gate node g that have gotten interconnected in response to the turn-on of the P-channel MOS transistor 121 increases from the potential Vini.

However, the current is less likely to flow along the above route as the potential at the gate node g becomes closer to the potential (Vel−|Vth|). Before the offset period ends, the potential on the data line 14 and at the gate node g is saturated to the potential (Vel−|Vth|). In this case, the capacitor 132 maintains the threshold voltage |Vth| of the P-channel MOS transistor 121 at the final stage of the offset period.

Write Period

After the initialization period has ended, the write period (d) comes. Over this write period, the control signal Gcmp(i) is at the H level, and the diode connection made by the P-channel MOS transistor 121 is thereby broken off. In addition, the control signal Gref is at the L level, and the N-channel MOS transistor 43 is thereby turned off. As a result, the route from the data line 14 on the (3j−2) column to the gate node g of the pixel circuit 110 on the i-th row and the (3j−2) column electrically floats. However, this route is kept at the potential (Vel−|Vth|) by the capacitors 50 and 132.

Over the write period, the control circuit 3 sequentially changes the potentials of the data signals Vd(j) into potentials according to gradation levels of the pixels on the i-th row and the (3j−2) column, the i-th row and the (3j−1) column, and the i-th row and the 3j-ith column. In response to the change in the potentials of the data signals, the control circuit 3 sequentially switches the control signals Sel(1), Sel(2), and Sel(3) to the H level in an exclusive manner. In this case, the control circuit 3 also outputs the control signals /Sel(1), /Sel(2), and /Sel(3), which are equivalent to the logical inversions of the control signals Sel(1), Sel(2), and Sel(3), respectively that are not illustrated in FIG. 7. As a result, in the demultiplexers 30, the transmission gates 34 on the leftmost, central, and the rightmost columns in each group are turned on in this order.

When the transmission gate 34 on the leftmost column in a certain group is turned on in response to the control signals Sel(1) and /Sel(1), the potential Vref at the node h connected to the second end of the capacitor 44 which has been fixed over the initialization and offset periods is changed into the potential of the data signal Vd(j), namely, a potential according to the gradation level of the pixel on the i-th row and the (3j−2) column, as illustrated in FIG. 11. In this case, the variation in the potential at the node h is denoted by $\Delta V$, and the changed potential is denoted by (Vref+$\Delta V$).

The gate node g connected to the first end of the capacitor 44 through the data line 14 increases to a potential (Vel−|Vth|+k1·$\Delta V$), which is the sum of the potential (Vel−|Vth|) that has been set during the offset period and the product of a capacitance ratio k1 and the variation in the potential at the node h. In this case, if the voltage Vgs of the P-channel MOS transistor 121 is expressed by an absolute value, the voltage Vgs can be (|Vth|−k1·$\Delta V$), which is the difference between the threshold voltage |Vth| and the increased amount of the potential at the gate node g.

The capacitance ratio k1 can be expressed by Crf1/(Cdt+Crf1). Strictly speaking, it is necessary to consider the capacitance Cpix of the capacitor 132. However, this capacitance Cpix may be ignored, because the capacitance Cpix is set to be sufficiently smaller than each of the capacitances Crf1 and Cdt.

After the write period for the i-th row has ended and the scan line 12 on the i-th row has been horizontally scanned, the light emission period comes. Over the light emission period, as described above, the control signal Gel(i) is set to the L level. In the pixel circuit 110, the P-channel MOS transistor 124 on the i-th row and the (3j−2) column is thereby turned on. In this case, the gate-source voltage Vgs of the P-channel MOS transistor 121 is expressed by (|Vth|−k1·$\Delta V$). Therefore, as explained with reference to FIG. 5, the current according to the gradation level is supplied to the OLED 130 with the threshold voltage of the P-channel MOS transistor 121 offset.

The above operation is being performed concurrently by not only the pixel circuit 110 on the i-th row and the (3j−2) column but also the pixel circuits 110 on the i-th row and other columns while the scan line 12 is being horizontally scanned. In fact, this operation is sequentially performed on the scan lines 12 on the i-th row (i=1, 2, 3 . . . (m−1), and m) over one frame period. Furthermore, the operation is repeated in units of frame periods.

According to this embodiment, a potential range $\Delta$Vgate of a gate node g is narrower than a potential range $\Delta$Vdata of a data signal; the potential range $\Delta$Vgate is a range in which the potential at the gate node g varies, and the potential range $\Delta$Vdata is a range in which the potential of the data signal varies. This configuration makes it possible to apply a voltage considering a gradation level between the gate and source of a P-channel MOS transistor 121 without the need to finely adjust the data signal. Consequently, it is possible to control currents supplied to OLEDs 130 with great precision even when the OLEDs 130 are mounted in tiny pixel circuits 110 each in which the supplied current is sensitive to a variation in a gate-source voltage Vgs of the P-channel MOS transistor 121.

As indicated by the broken line in FIG. 3, in fact, a parasitic capacitance Cprs is present between a data line 14 and a gate node g of the P-channel MOS transistor 121 in each pixel circuit 110. When the potential on the data line 14 largely fluctuates, this fluctuation may be transferred to the gate node g through the capacitance Cprs, thereby causing a lowered display quality such as crosstalk or uneven luminance. This parasitic capacitance Cprs influences a pixel circuit 110 more significantly as the pixel circuit 110 is smaller in size.

This embodiment, however, can reduce the influence of the parasitic capacitance Cprs by setting the potential variation range of the data line 14 to be narrower than the potential range $\Delta$Vdata of the data signal.

The write period ends in response to the timing at which the scan signal Gwr(i) is switched to the H level. The time interval between the end of the write period for the scan line 12 on the i-th row and the start of the initialization period for the scan line 12 on the (i+1)th row corresponds to a transition period. In this embodiment, the scan line drive circuit 20 switches the control signals Gorst(i) and Gel(i) for the pixel circuits 110 on any scan line 12 to the H and L levels, respectively, within the transition period. In response, the pixel circuits 110 connected to this scan line starts the light emission period. Likewise, the scan line drive circuit 20 switches the control signals Gorst(i) and Gel(i) for the pixel circuits 110 on any scan line 12 to the L and H levels, respectively, within the transition period. In response, the pixel circuits 110 connected to this scan line ends the light emission period.

FIG. 7 illustrates the example in which the pixel circuits 110 on the i-th row start the light emission period within the transition period following the write period. In this example, the scan line drive circuit 20 switches the control signals Gorst(i) and Gel(i) for the pixel circuits 110 along the scan line 12 on the i-th row to the H and L levels, respectively. Furthermore, FIG. 7 also illustrates the examples in which the pixel circuits 110 along the scan line 12 on an ia-th row, which differs from the i-th row, start the light emission period and in which the pixel circuits 110 along the scan line 12 on an ib-th row, which differs from the i-th and ia-th rows, ends the light emission period. Each pixel circuit 110 operates over the light emission period in the above-described manner.

According to this embodiment, when a pixel circuit 110 creates a black image during a light emission period, a transistor circuit 120 outputs a current that equals the sum of a drain current Ids driven by a P-channel MOS transistor 121 in accordance with the gate-source voltage equivalent to the threshold voltage, a leakage current IL121 of the P-channel MOS transistor 121, a leakage current IL123 of a P-channel MOS transistor 123, and leakage currents IL124a and IL124b of the P-channel MOS transistor 124. In addition, a P-channel MOS transistor 125 outputs a leakage current IL125 from its n well through a connection node between the P-channel MOS transistor 125 and an OLED 130. However, during the light emission period for the pixel circuit 110, these output currents bypass the OLED 130 and flows to a feeder line 16 as an off-state current Ioff_orst of the P-channel MOS transistor 125. Consequently, this embodiment is effective in suppressing the black floating from occurring when each pixel circuit 110 creates a black image.

Second Embodiment

Figure 12:
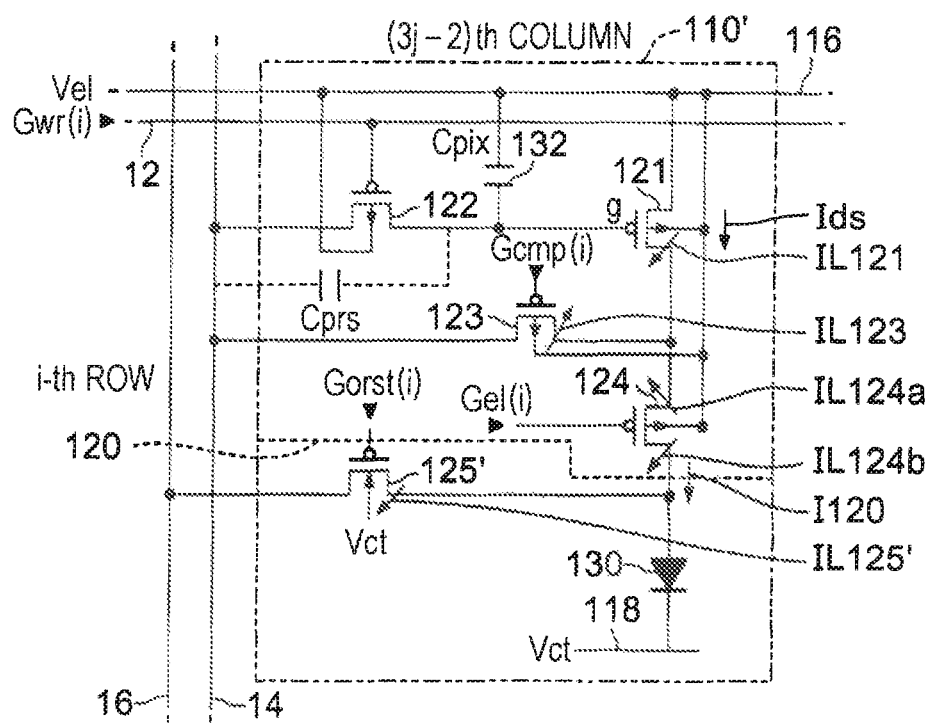
FIG. 12 is a circuit diagram illustrating a configuration of a pixel circuit in an electro-optical device according to a second embodiment of the invention.

FIG. 12 is a circuit diagram illustrating a configuration of a pixel circuit 110' in an electro-optical device according to a second embodiment of the invention. In this embodiment, instead of the P-channel MOS transistor 125 in the foregoing first embodiment, an N-channel MOS transistor 125' is used. The gate of this N-channel MOS transistor 125' is supplied with a signal equivalent to the logical inversion of the signal supplied to the gate of the P-channel MOS transistor 125. Other configurations of the pixel circuit 110' are substantially the same as those of each pixel circuit 110.

Figure 13:
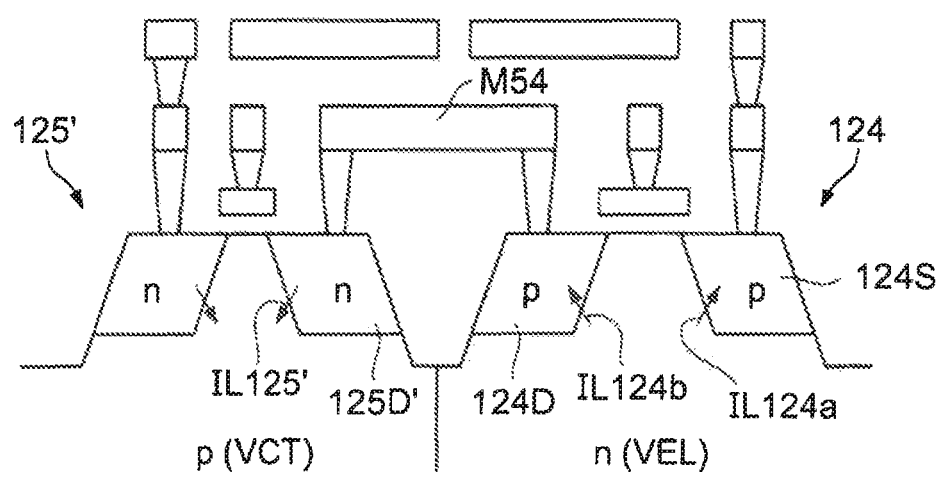
FIG. 13 is a cross-sectional view of a configuration of the light emission control transistor and the discharge transistor in the pixel circuit in FIG. 12.

FIG. 13 is a cross-sectional view of a configuration of a P-channel MOS transistor 124 and the N-channel MOS transistor 125' in the pixel circuit 110'. As illustrated in FIG. 13, a drain 125D', formed of an N-type diffusion layer, of the N-channel MOS transistor 125' which is connected to the anode of an OLED 130 is formed in a p well to which a lowest potential VCT is to be applied. In this configuration, no leakage current flows from the drain 125D' of the N-channel MOS transistor 125' to the outside. Conversely, a leakage current IL125' flows from the drain 125D' to the p well. In this embodiment, when the OLED 130 does not emit light, an off-state current Ioff_orst flows through the N-channel MOS transistor 125'. The off-state current Ioff_orst equals the sum of a channel current flowing from the drain to source of the N-channel MOS transistor 125' in the off state and the leakage current IL125' flowing from the drain 125D' to the p well. This off-state current Ioff_orst is set to be larger than a current I120 that is output from a transistor circuit 120 upon the display of a black image.

Similar to the foregoing first embodiment, this embodiment is effective in suppressing the black floating from occurring when each pixel circuit 110 creates a black image. In this embodiment, the leakage current flowing from the drain 125D' to the p well is added to the off-state current Ioff_orst. Therefore, the leakage current flowing from the source to drain of the N-channel MOS transistor 125' in the off state is decreased by an amount corresponding to the leakage current flowing from the drain 125D' to the p well. Consequently, for example, it is possible to easily control the threshold of the N-channel MOS transistor 125'.

Figure 14:
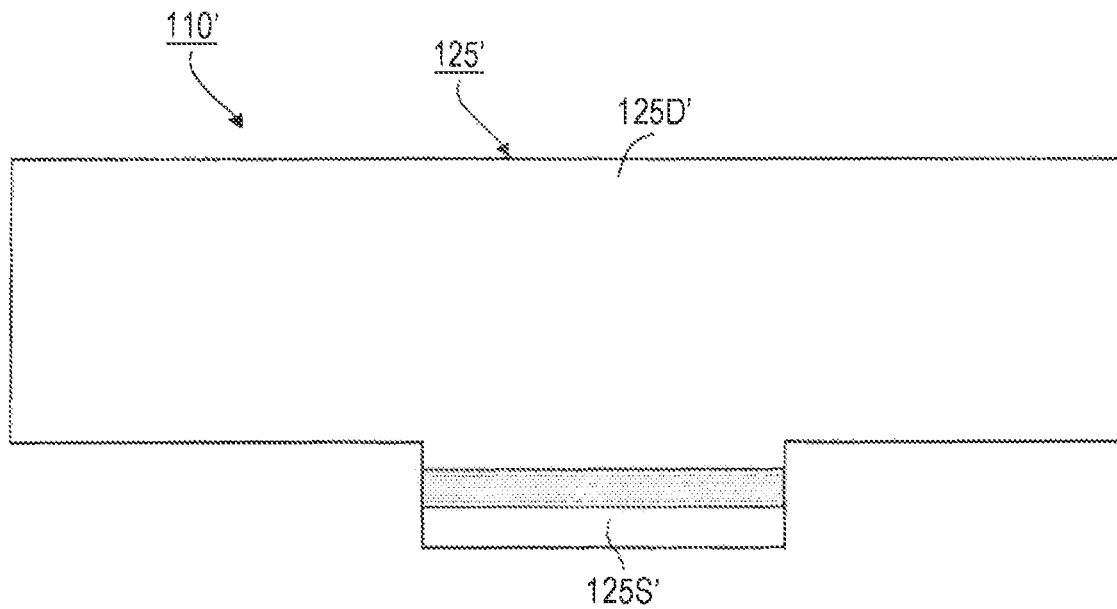
FIG. 14 is a plan view of the discharge transistor in the pixel circuit.

To enhance the effect of this embodiment, as an example of FIG. 14, the drain 125D' of the discharge transistor 125' which is connected to the OLED 130 preferably has a smaller area than that of a source 125S' of the discharge transistor 125'. By widening the area of the drain 125D', the leakage current IL125' can be increased.

Figure 15:
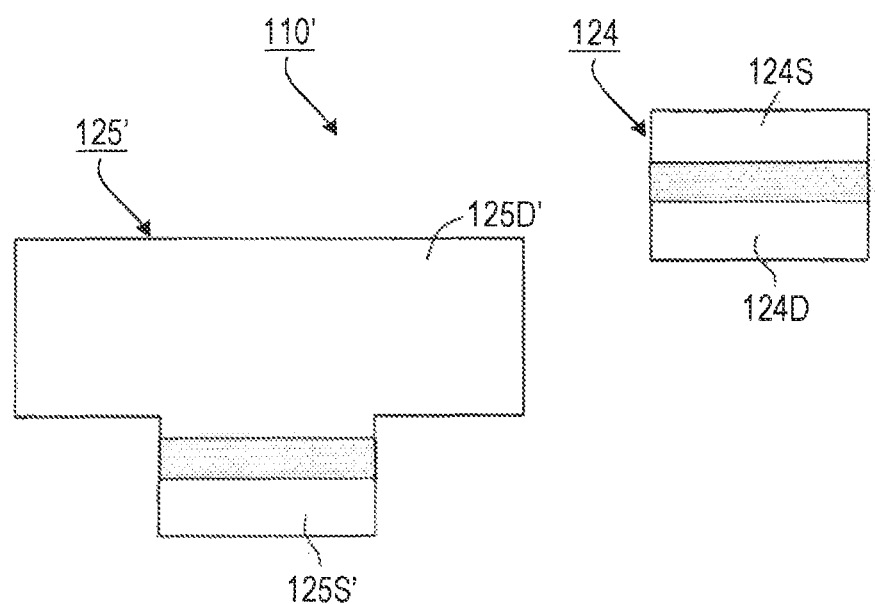
FIG. 15 is plan views of examples of the light emission control transistor and the discharge transistor in the pixel circuit.

As an example of FIG. 15, the area of the drain 125D' of the N-channel MOS transistor 125' is preferably larger than the total area of a drain 124D and source 124S of the P-channel MOS transistor 124. The P-channel MOS transistor 124 switches and controls the flow of the drive current that the P-channel MOS transistor 121 supplies to the OLED 130. Therefore, the P-channel MOS transistor 124 is usually designed to have a large channel width so as not to affect the current flow. However, a larger channel width may result in a larger total area of the drain 124D and the source 124S, thereby generating larger amounts of leakage currents IL124a and IL124b. To decrease these leakage currents, the area of the drain 125D' of the N-channel MOS transistor 125' is preferably designed to be larger than the total area of the drain 124D and source 124S of the P-channel MOS transistor 124. By designing the area of the drain 125D' in this manner, the leakage current IL125' that exceeds the sum of the leakage currents IL124a and IL124b generated in the P-channel MOS transistor 124 is caused to flow from the drain 125D' to the p well in the P-channel MOS transistor 125. This configuration can help suppress an occurrence of the black floating.

Modification

The invention is not limited to the foregoing first and second embodiments, and thus various modifications are possible. Some examples of such modifications will be described below. It should be noted that some of these examples may be combined as appropriate.

First Modification

Although both of the pixel circuit 110 in the foregoing first embodiment and the pixel circuit 110' in the foregoing second embodiment include an OLED as an electro-optic element, the electro-optic element may be any light emitting element that emits light of luminance proportional to a driven current. As an alternative example, the light emitting element may be an inorganic light emitting diode or other light emitting diode (LED).

Second Modification

In the foregoing first and second embodiments and the first modification, the data transfer circuit 40 transfers electric charge to the pixel circuits 110, thereby writing data into the pixel circuits 110. However, there is no limitation on a method of writing data into the pixel circuits 110. Although each pixel circuit 110 is provided with the five transistors in the foregoing first and second embodiments and the first modification, each pixel circuit 110 does not necessarily have to be provided with the P-channel MOS transistor 123. In short, each pixel circuit 110 only has to be provided with the P-channel MOS transistors 121, 122, and 124 that serve as drive, write, and light emission control transistors, respectively.

Application Example

Next, a description will be given below of an electronic apparatus according to an application example which employs the electro-optical device 1 according to any one of the first and second embodiments and the first and second modifications. The electro-optical device 1 is intended to display a high-resolution image with small-sized pixels. A head mount display (HMD) is employed as an example of the electronic apparatus and will be described below.

Figure 16:
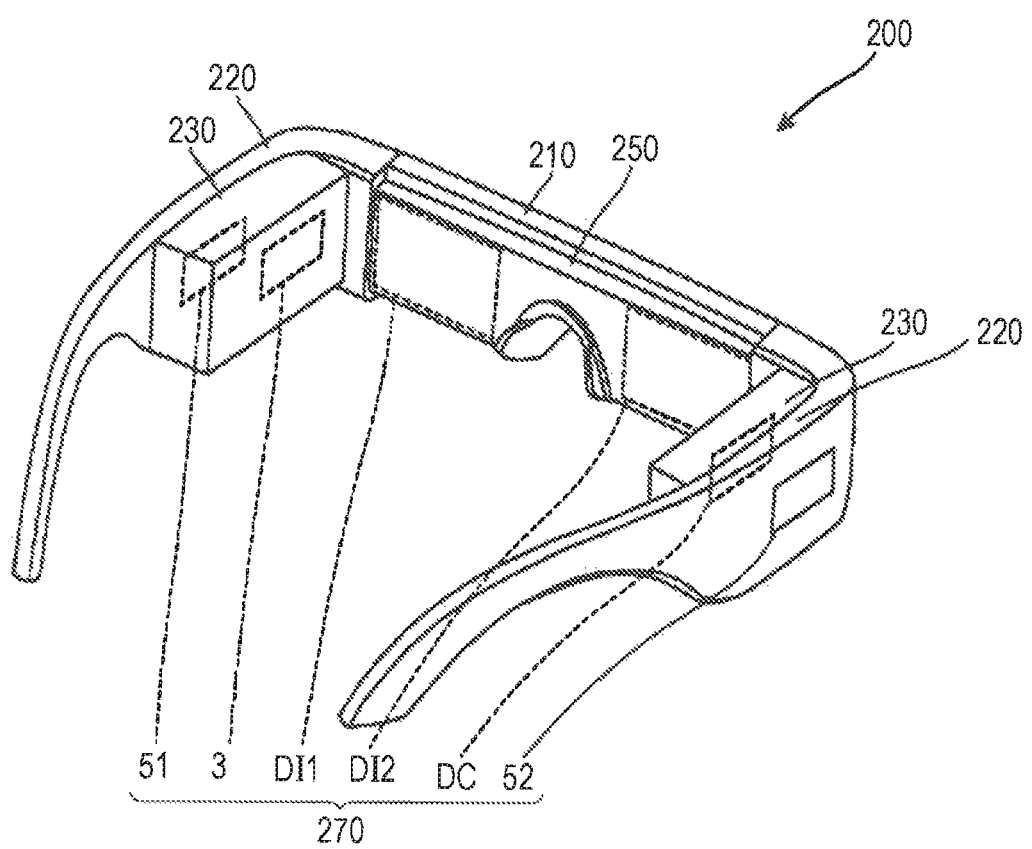
FIG. 16 is a view of an appearance of a head mount display (HMD) according to an application example of the invention.

FIG. 16 is a schematic view of an HMD 200 that employs the electro-optical device according to one of the first and second embodiments and the first and second modifications. As illustrated in FIG. 16, the HMD 200 includes a front frame 210, a pair of side frames 220, an optical panel 250, circuit covers 230, and an electro-optical device 270. The front frame 210 is to be positioned in front of a user's head. The pair of side frames 220 is connected to both ends of the front frame 210 and to be positioned on both sides of the user's head. The optical panel 250 is fixed to the front frame 210 and aims to cover the user's eyes. The circuit covers 230 are fixed to the respective side frames 220. The electro-optical device 270 adjusts the luminance of the screen by using the function described in the first and second embodiments and the first and second modifications.

The electro-optical device 270 in this application example includes a pair of display panels DI1 and DI2. Furthermore, the electro-optical device 270 includes a pair of adjusters 51 and 52 to adjust a light emission period in the manner described in the first embodiment.

The pair of display panels DI1 and DI2 is mounted on the optical panel 250 so as to be positioned in front of the user's left eye and right eye, respectively. The pair of display panels DI1 and DI12 emits light through the optical panel 250. The user is expected to view the light from the display panel DI1 with the left eye and the light from the display panel DI2 with the right eye.

In the HMD 200, the adjuster 51 is operably disposed on one of the pair of side frames 220, whereas the adjuster 52 is operably disposed on the other of the pair of side frames 220. In addition, a control circuit 3 is mounted in one of the circuit covers 230 which is fixed to a corresponding one of the pair of side frames 220, whereas a power supply circuit DC is mounted in the other of the circuit covers 230. It should be noted that these arrangements may be modified as appropriate.

Figure 17:
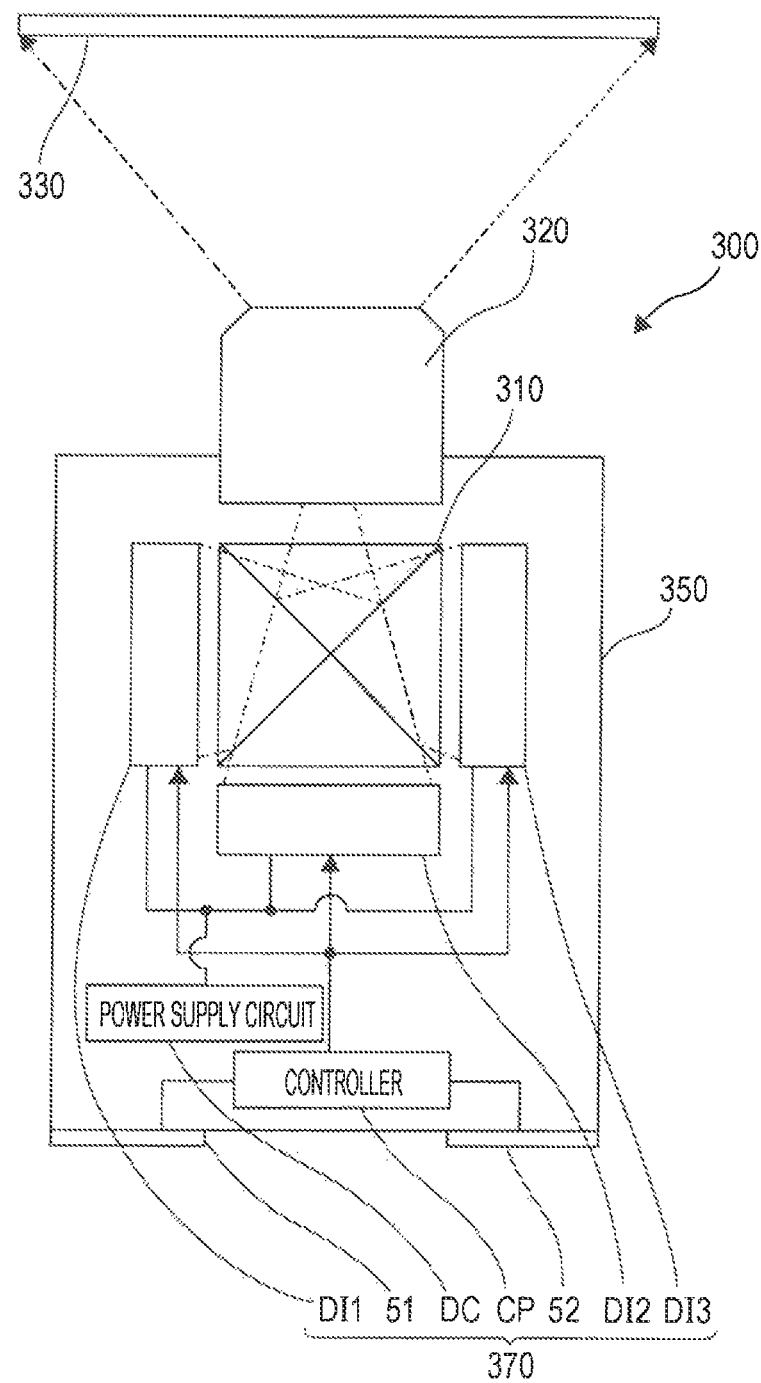
FIG. 17 is a view of an optical configuration of a projector according to another application example of the invention.

FIG. 17 is a schematic view of a projector that employs the electro-optical device according to one of the first and second embodiments and the first and second modifications. As illustrated in FIG. 17, the projector 300 includes a housing 350, an electro-optical device 370, a dichroic prism 310, and a projection lens 320.

The electro-optical device 370 includes three display panels DI1, DI2, and DI3. Furthermore, the electro-optical device 370 includes adjusters 51 and 52, a power supply circuit DC, and a controller CP.

The display panels DI1, DI2, and DI3 are disposed inside the housing 350. Each of the display panels DI1, DI2, and DI3 has arrays of color pixels. In this example application, the display panel DI1 displays a red image; the display panel DI2 displays a green image; and the display panel DI3 displays a blue image. Each of the display panels DI1, DI2, and DI3 has a display section. These display sections are disposed adjacent to one another with their emission light beams forming approximately 90 degrees with one another. In this example application, the display panel DI1 is disposed adjacent to the display panel DI2; the display panel DI2 is disposed adjacent to the display panel DI3; and the display panel DI1 is disposed opposite the display panel DI3.

The dichroic prism 310 is disposed surrounded by the display panels DI1, DI12, and DI3. The dichroic prism 310 has side surfaces that the light beams are to enter. These side surfaces are disposed opposite the display panels DI1, DI2, and DI3. In addition, the dichroic prism 310 has a side surface from which a light beam is to be output. This side surface is disposed opposite the projection lens 320. The light beam is output from the inside to outside of the housing 350 through the projection lens 320. The projection lens 320 may be composed of either a single lens or a plurality of lenses.

The adjusters 51 and 52 are operably disposed on the exterior of the housing 350 to adjust the light emission period in the manner described in the first embodiment. Upon operation, the projector 300 mixes the red light beam from the display panel DI1, the green light beam from the display panel DI2, and the blue light beam from the display panel DI3 to make a mixed color light beam. Then, the projector 300 projects this mixed color light beam onto a screen 330. It should be noted that the screen 330 may be either of a light transmissive or light reflective type.

In this example application, the display panels DI1, DI2, and DI13 emit specific color light beams, namely, red, green, and blue light beams, respectively. Alternatively, the display panels DI1, DI12, and DI13 may emit any other color light beams.

In this example application, the display panel DI1 displays a red image; the display panel DI12 displays a green image; and the display panel DI3 displays a blue image. However, the display panels DI1, DI12, and DI13 do not necessarily have to display images. Alternatively, the display panel DI1 may be a red light source; the display panel DI12 may be a green light source; and the display panel DI3 may be a blue light source. In this case, liquid crystal panels or other optical panels are disposed in front of the display panels DI1, DI2, and DI3. The display panels DI1, DI2, and DI13 emit light beams to such optical panels, which then display images on the basis of the light beams.

The electro-optical device 1 described above is applicable to not only the HMD 200 but also an electronic viewfinder for video cameras or digital cameras with interchangeable lenses, as well as an information display section for portable information processing devices such as tablets, wristwatches, and projectors.

The entire disclosure of Japanese Patent Application No. 2017-047109, filed Mar. 13, 2017 is expressly incorporated by reference herein.

What is claimed is:

1. A pixel circuit comprising:
   a transistor circuit that outputs a drive current in accordance with a data signal, the transistor circuit including a drive transistor, a gate node of the drive transistor being supplied with the data signal;
   a light emitting element that emits light with luminance corresponding to the drive current, the light emitting element being connected to the transistor circuit;
   a discharge transistor that, when the data signal indicates zero, causes a flow of the drive current to bypass the light emitting element;
   an off-state current generated in the discharge transistor in an off state;
   a first leakage current output from the transistor circuit when the data signal indicates zero; and
   a second leakage current of the discharge transistor, wherein:
   a first channel length between a source of the discharge transistor and a drain of the discharge transistor is smaller than a second channel length between a source of the drive transistor and a drain of the drive transistor;
   an absolute value of a threshold voltage of the discharge transistor is lower than an absolute value of a threshold voltage of the drive transistor; and
   the off-state current is larger in amount than a sum of the first leakage current and the second leakage current.

2. The pixel circuit according to claim 1, wherein:
   the drive transistor in the transistor circuit generates the drive current in accordance with the data signal; and
   when the light emitting element does not emit the light, the discharge transistor is turned on to connect a discharge feeder line to a node at which the transistor circuit is connected to the light emitting element.

3. An electro-optical device comprising the pixel circuit according to claim 2.

4. The pixel circuit according to claim 1, wherein the drive transistor is a P-channel transistor, and the discharge transistor is an N-channel transistor.

5. The pixel circuit according to claim 4, wherein:
   the transistor circuit includes a light emission control transistor connected between the drive transistor and the light emitting element;
   the light emission control transistor is a P-channel transistor; and
   the drain of the discharge transistor has a wider area than a total area of a drain and a source of the light emission control transistor.

6. An electro-optical device comprising the pixel circuit according to claim 5.

7. An electro-optical device comprising the pixel circuit according to claim 4.

8. The pixel circuit according to claim 1, wherein
the drain of the discharge transistor which is connected to the light emitting element has a wider area than an area of the source of the discharge transistor.

9. An electro-optical device comprising the pixel circuit according to claim 8.

10. The pixel circuit according to claim 1, wherein:
the drive transistor in the transistor circuit generates the drive current in accordance with the data signal;
when the light emitting element does not emit the light, the discharge transistor is turned on to connect a discharge feeder line to a node at which the transistor circuit is connected to the light emitting element; and
the drive transistor is an enhancement type transistor, and the discharge transistor is a depletion type transistor.

11. An electro-optical device comprising the pixel circuit according to claim 10.

12. An electro-optical device comprising the pixel circuit according to claim 1.

13. The pixel circuit according to claim 1, wherein:
the drive transistor is a P-channel transistor, and the discharge transistor is an N-channel transistor; and
the drain of the discharge transistor which is connected to the light emitting element has a wider area than an area of the source of the discharge transistor.

14. A pixel circuit comprising:
a transistor circuit that outputs a drive current in accordance with a data signal, the transistor circuit including a drive transistor, a gate node of the drive transistor being supplied with the data signal;
a light emitting element that emits light with luminance corresponding to the drive current, the light emitting element being connected to the transistor circuit;
a discharge transistor that causes a flow of a part of the drive current in a light emission period;
an off-state current generated in the discharge transistor in an off state;
a first leakage current output from the transistor circuit when the data signal indicates zero; and
a second leakage current of the discharge transistor, wherein:
a first channel length between a source of the discharge transistor and a drain of the discharge transistor is smaller than a second channel length between a source of the drive transistor and a drain of the drive transistor;
an absolute value of a threshold voltage of the discharge transistor is lower than an absolute value of a threshold voltage of the drive transistor; and
the off-state current is larger in amount than a sum of the first leakage current and the second leakage current.

15. The pixel circuit according to claim 14, wherein:
the drive transistor is a P-channel transistor, and the discharge transistor is an N-channel transistor; and
the drain of the discharge transistor which is connected to the light emitting element has a wider area than an area of the source of the discharge transistor.

16. A pixel circuit comprising:
a transistor circuit that outputs a drive current in accordance with a data signal, the transistor circuit including a drive transistor, a gate node of the drive transistor being supplied with the data signal;
a light emitting element that emits light with the luminance corresponding to drive current, the light emitting element being connected to the transistor circuit;
a discharge transistor that is turned off to cause a flow of the drive current;
an off-state current generated in the discharge transistor in the off state;
a first leakage current output from the transistor circuit when the data signal indicates zero; and
a second leakage current of the discharge transistor, wherein:
a first channel length between a source of the discharge transistor and a drain of the discharge transistor is smaller than a second channel length between a source of the drive transistor and a drain of the drive transistor;
an absolute value of a threshold voltage of the discharge transistor is lower than an absolute value of a threshold voltage of the drive transistor; and
the off-state current is larger in amount than a sum of the first leakage current and the second leakage current.

17. The pixel circuit according to claim 16, wherein:
the drive transistor is a P-channel transistor, and the discharge transistor is an N-channel transistor; and
the drain of the discharge transistor which is connected to the light emitting element has a wider area than an area of the source of the discharge transistor.

* * * * *